United States Patent
Takeda et al.

(10) Patent No.: US 12,036,634 B2
(45) Date of Patent: Jul. 16, 2024

(54) SUBSTRATE PROCESSING CONTROL SYSTEM, SUBSTRATE PROCESSING CONTROL METHOD, AND PROGRAM

(71) Applicant: Ebara Corporation, Tokyo (JP)

(72) Inventors: Koichi Takeda, Tokyo (JP); Tsuneo Torikoshi, Tokyo (JP); Kunio Oishi, Tokyo (JP); Katsuhide Watanabe, Tokyo (JP); Hozumi Yasuda, Tokyo (JP); Yu Ishii, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1155 days.

(21) Appl. No.: 16/338,931

(22) PCT Filed: Sep. 7, 2017

(86) PCT No.: PCT/JP2017/032306
§ 371 (c)(1),
(2) Date: Apr. 2, 2019

(87) PCT Pub. No.: WO2018/074091
PCT Pub. Date: Apr. 26, 2018

(65) Prior Publication Data
US 2019/0240799 A1    Aug. 8, 2019

(30) Foreign Application Priority Data

Oct. 18, 2016 (JP) .................................. 2016-204675
Oct. 18, 2016 (JP) .................................. 2016-204676
Oct. 18, 2016 (JP) .................................. 2016-204678

(51) Int. Cl.
*B24B 37/005* (2012.01)
*B24B 37/12* (2012.01)
(Continued)

(52) U.S. Cl.
CPC ............. *B24B 37/005* (2013.01); *B24B 37/12* (2013.01); *B24B 37/14* (2013.01); *B24B 49/03* (2013.01);
(Continued)

(58) Field of Classification Search
CPC ....... B24B 37/005; B24B 49/03; B24B 49/04; B24B 55/06; H01L 21/304
(Continued)

(56) References Cited

U.S. PATENT DOCUMENTS 6,540,591 B1 * 4/2003 Pasadyn ................ B24B 37/042
451/6
6,592,429 B1 * 7/2003 Campbell ............... B24B 41/06
451/63
(Continued)

FOREIGN PATENT DOCUMENTS

JP    H03-049846 A    3/1991
JP    H1190816 A  *  4/1994
(Continued)

OTHER PUBLICATIONS

JP2002343753_Translated_Description (Year: 2002).*
(Continued)

*Primary Examiner* — Joel D Crandall
*Assistant Examiner* — Jacob Adam Montgomery
(74) *Attorney, Agent, or Firm* — Leydig, Voit & Mayer, Ltd.

(57) ABSTRACT

A local polishing system comprises: a particle estimation unit (30) for estimating the film thickness distribution of a wafer; a local polishing region setting unit (11) for setting a local polishing region on the wafer based on the film thickness distribution; a polishing head selection unit (12) for selecting a polishing head based on the size of the local polishing region; a model storage (20) holding a recipe
(Continued)

generating model that defines the relation between an input node and an output node, the input node being an attribute of the local polishing region, the output node comprising a recipe for a polishing process; a polishing recipe generator (13) that puts an attribute of the local polishing region set by the local polishing region setting unit (11) into the input node of the recipe generating model and determines a polishing recipe for polishing the local polishing region; and a polishing recipe transmitter (15) for transmitting data of the polishing recipe to a local polishing module (200) that performs local polishing.

13 Claims, 35 Drawing Sheets

(51) Int. Cl.
  *B24B 37/14* (2012.01)
  *B24B 49/03* (2006.01)
  *B24B 49/04* (2006.01)
  *B24B 55/06* (2006.01)
  *H01L 21/304* (2006.01)
(52) U.S. Cl.
  CPC ............ *B24B 49/04* (2013.01); *B24B 55/06* (2013.01); *H01L 21/304* (2013.01)
(58) Field of Classification Search
  USPC ............................................................ 451/5
  See application file for complete search history.

(56) References Cited

U.S. PATENT DOCUMENTS

| | | | |
|---|---|---|---|
| 9,102,033 B2* | 8/2015 | Hui | H01L 21/30625 |
| 2002/0197745 A1* | 12/2002 | Shanmugasundram | |
| | | | G05B 19/19 |
| | | | 438/459 |
| 2005/0239222 A1* | 10/2005 | Guthrie | B24B 49/03 |
| | | | 438/14 |
| 2005/0245169 A1* | 11/2005 | Morisawa | B24B 37/042 |
| | | | 451/41 |
| 2009/0209176 A1 | 8/2009 | Katsuoka et al. | |
| 2010/0273398 A1* | 10/2010 | Misra | B24B 37/042 |
| | | | 451/28 |
| 2013/0122613 A1 | 5/2013 | Wang et al. | |
| 2013/0241075 A1* | 9/2013 | Yeh | H01L 22/12 |
| | | | 438/692 |
| 2013/0267148 A1* | 10/2013 | Ramavajjala | B24B 37/005 |
| | | | 700/121 |
| 2013/0268106 A1 | 10/2013 | Mitani | |
| 2014/0080229 A1* | 3/2014 | Zhang | B24B 49/04 |
| | | | 257/E21.53 |
| 2015/0352686 A1 | 12/2015 | Wu et al. | |
| 2016/0074988 A1 | 3/2016 | Yamaguchi et al. | |

FOREIGN PATENT DOCUMENTS

| | | |
|---|---|---|
| JP | H10-86039 A | 4/1998 |
| JP | H10-264011 A | 10/1998 |
| JP | H10264011 A * | 10/1998 |
| JP | H11-090816 A | 4/1999 |
| JP | H11-251272 A | 9/1999 |
| JP | 2000-288915 A | 10/2000 |
| JP | 2001-523586 A | 11/2001 |
| JP | 2002-343753 A | 11/2002 |
| JP | 2002343753 A * | 11/2002 |
| JP | 2003-059887 A | 2/2003 |
| JP | 2003-285262 A | 10/2003 |
| JP | 2005-317864 A | 11/2005 |
| JP | 2009-194134 A | 8/2009 |
| JP | 2010-221370 A | 10/2010 |
| JP | 2011-060977 A | 3/2011 |
| JP | 2013-176828 A | 9/2013 |
| JP | 2016-058724 A | 4/2016 |
| KR | 20070068285 A * | 6/2007 |
| WO | WO 1999-025520 A1 | 5/1999 |

OTHER PUBLICATIONS

JPH10264011_Translated_Description (Year: 1998).*
JPH1190816_Translated_Description (Year: 1994).*
KR_20070068285_Translated_Description (Year: 2007).*
Japan Patent Office, Office Action in Japanese Application No. 2016-204676 (Oct. 6, 2020).
Japan Patent Office, Office Action in Japanese Application No. 2016-204676 (Jul. 14, 2020).
Japan Patent Office, International Search Report in International Application No. PCT/JP2017/032306 (Nov. 21, 2017).

* cited by examiner

Fig. 13

| No. | Attributes of local polishing region | | | Polishing recipe | Performance (score) |
|---|---|---|---|---|---|
| | Film thickness | Height | Width | | |
| 1 | | | | | |
| 2 | | | | | |
| 3 | | | | | |
| ⋮ | ⋮ | ⋮ | ⋮ | ⋮ | ⋮ |

SUBSTRATE PROCESSING CONTROL SYSTEM, SUBSTRATE PROCESSING CONTROL METHOD, AND PROGRAM

CROSS-REFERENCE TO RELATED APPLICATIONS

This patent application is the U.S. national phase of International Application No. PCT/JP2017/032306, filed Sep. 7, 2017, which claims the benefit of Japanese Patent Application No. 2016-204675, filed on Oct. 18, 2016, and Japanese Patent Application No. 2016-204676, filed on Oct. 18, 2016, and Japanese Patent Application No. 2016-204678, filed on Oct. 18, 2016, which are incorporated by reference in their entireties herein.

TECHNICAL FIELD

This invention relates to a technique for controlling substrate processing to be performed on a substrate.

BACKGROUND ART

Recently, processing apparatuses are used to perform various processes on objects to be processed (e.g. substrates including semiconductor wafers, or a variety of films formed on surfaces of substrates). An example of those processing apparatuses is a CMP (Chemical Mechanical Polishing) apparatus for performing polishing processes etc. on objects to be processed.

A CMP apparatus comprises a polishing unit for performing a polishing process on an object to be processed, a cleaning unit for performing cleaning and drying processes on an object to be processed, a loading/unloading unit for transferring an object to be processed to the polishing unit and for receiving an object to be processed on which the cleaning unit has performed the cleaning and drying processes, and the like.

U.S. Patent Application No. 2013/0122613 discloses a CMP technique that improves the precision in planarizing substrate surfaces. The invention described in the above patent document comprises a non-planar surface detector downstream of a CMP station, and a localized planarization station performs planarization when the height of a non-planar feature detected by the detector is greater than or equal to a predetermined threshold. In doing so, the localized planarization station sets a planarization time according to the height of the detected non-planar feature, and carries out planarization for the time.

SUMMARY OF THE INVENTION

Problems to be Solved by the Invention

With the CMP technique described in the patent document mentioned above, the planarization process is performed just for a time according to the height of a non-planar feature detected by the detector, and therefore it is required to know the accurate height of a non-planar feature to be planarized. For this reason, the detection process has to be performed with certain numbers of measurement points being established on a substrate, and takes time.

Additionally, with the CMP technique described in the patent document mentioned above, the planarization process is performed locally on a non-planar feature detected by the detector just for a time according to the height of the non-planar feature, and therefore the localized planarization takes so much time when there are a lot of high non-planar features. On the other hand, entire-surface planarization (entire polishing) using a planarization member (a polishing pad, etc.) larger than a wafer surface enables a plurality of non-planar features to be polished at once but simultaneously causes a planar surface to be polished, which limits how much the difference in level between non-planar and planar surfaces can be eliminated.

A purpose of the invention made in view of the above-mentioned background is to provide a substrate processing control system that can locally process a substrate in a short time.

Means for Solving the Problems

A substrate processing control system of the invention is a system for controlling a polisher that locally polishes a substrate, and the substrate processing control system comprises: a film thickness distribution estimation unit that measures the film thickness of the substrate and estimates the film thickness distribution of the substrate based on the measurement result; a local polishing region setting unit for setting a local polishing region on the substrate based on the film thickness distribution; a polishing head selection unit for selecting a polishing head based on the size of the local polishing region; a model storage holding a recipe generating model that defines the relation between an input node and an output node, the input node being an attribute of the local polishing region, the output node comprising a recipe for a polishing process; a polishing recipe generator that puts an attribute of the local polishing region set by the local polishing region setting unit into the input node of the recipe generating model and determines a polishing recipe for polishing the local polishing region; and a polishing recipe transmitter for transmitting data of the polishing recipe to a polisher that performs local polishing. This input node of the recipe generating model may comprise a plurality of input nodes that may be the outline of the local polishing region and the average film thickness thereof.

The invention allows for generating a polishing recipe to perform local polishing without an accurate film thickness distribution of a substrate being determined by a time-consuming measurement because the film thickness distribution of a substrate is estimated based on a film thickness measurement result and a polishing recipe corresponding to the estimated film thickness distribution is determined.

In the substrate processing control system of the invention, the local polishing region setting unit may change a criterion for setting a local polishing region depending on whether the precision or throughput of substrate processing is given priority.

Uneven regions on a substrate are preferably individually polished when polishing is performed with precision being given priority, and a rather broad area is preferably polished at once when polishing is performed with throughput being given priority. The invention allows a local polishing region to be set depending on whether precision or throughput is given priority.

In the substrate processing control system of the invention, the film thickness distribution estimation unit may estimate the film thickness distribution also based on an etching pattern of a substrate to be polished.

Since projections and depressions on a substrate surface are affected by an underlying wiring pattern, the accuracy of estimation of the film thickness distribution can be improved by estimating it based on an etching pattern.

The substrate processing control system of the invention may control local polishing to be performed on an entirely polished substrate, and the recipe generating model may have a condition of the entire polishing as an input node.

Since there is a relation between a condition of entire polishing and the state of an entirely polished substrate, a polishing recipe for appropriate local polishing can be determined by setting a condition of the entire polishing as an input node.

The substrate processing control system of the invention may comprise a simulator that simulates the film thickness distribution of a substrate and throughput to be achieved by local polishing according to the polishing recipe and may determine whether the polishing recipe is to be adopted or not based on the simulation result.

This configuration allows a determined polishing recipe to be checked and therefore can enhance the yield of local polishing performed in accordance with the polishing recipe.

In the substrate processing control system of the invention, the model storage may hold a plurality of recipe generating models of different types, the polishing recipe generator may determine a plurality of polishing recipes using different recipe generating models, and the simulator may determine a single polishing recipe based on simulation results of a plurality of polishing recipes determined by using different recipe generating models.

This configuration allows local polishing to be performed by using the best polishing recipe of a plurality of polishing recipes determined with different recipe generating models.

The substrate processing control system of the invention may comprise a learning unit for performing learning on the recipe generating model based on results of simulations performed on a plurality of local polishing regions by the simulator. This can improve the accuracy of the recipe generating model for determining a polishing recipe.

The substrate processing control system of the invention may comprise a learning unit for performing learning on the recipe generating model based on a result of local polishing actually performed according to the polishing recipe. Learning performed on the recipe generating model by using a result of actual polishing in this manner can improve the accuracy of the recipe generating model.

The substrate processing control system of the invention may have an actual result data storage holding a previously generated polishing recipe and data on the film thickness distribution of a substrate polished by using the polishing recipe, and may read from the actual result data storage a predetermined number of polishing recipes approximate to the film thickness distribution of a substrate estimated by the film thickness distribution estimation unit and, in the substrate processing control system, the simulator may determine a single polishing recipe based on simulation results of a plurality of polishing recipes.

This configuration allows an appropriate polishing recipe to be selected from a predetermined number of proven polishing recipes used for substrates having approximate film thickness distributions, and therefore enables to omit a polishing recipe generation process.

The substrate processing control system of the invention may comprise an output unit for outputting a simulation result obtained by the simulator. This configuration allows for checking a simulation result of a determined polishing recipe.

In the substrate processing control system of the invention, the simulator may comprise a simulation model. The simulation model may perform learning based on a result of local polishing actually performed according to the polishing recipe. This allows for a precise prediction of a result of polishing performed in accordance with the polishing recipe.

The substrate processing control system of the invention may comprise a data receiver for receiving data on local polishing transmitted from a plurality of polishers connected to the data receiver via a network. This configuration allows a large amount of actual polishing data to be collected from a plurality of polishers, and thus allows learning to be performed on the recipe generating model.

A substrate processing control system according to another aspect of the invention is a system for controlling a scrubbing process for removing a foreign material existing on a substrate, and comprises: a particle distribution estimation unit that detects a particle on the substrate and estimates the particle distribution based on the detection result; a scrubbing region setting unit for setting a scrubbing region on the substrate based on the particle distribution; a scrubbing member selection unit for selecting a scrubbing member based on the size of the scrubbing region; a model storage holding a recipe generating model that defines the relation between an input node and an output node, the input node being an attribute of the scrubbing region, the output node comprising a recipe for a scrubbing process; a scrubbing recipe generator that puts an attribute of the scrubbing region set by the scrubbing region setting unit into the input node of the recipe generating model and determines a scrubbing recipe for scrubbing the scrubbing region; and a scrubbing recipe transmitter for transmitting data of the scrubbing recipe to a substrate processing apparatus that performs scrubbing. This input node of the recipe generating model may comprise a plurality of input nodes that may be the outline of the scrubbing region and the density of the particle.

The invention allows for generating a scrubbing recipe to perform scrubbing without an accurate particle distribution of a substrate being determined by a time-consuming measurement because the particle distribution of a substrate is estimated based on a particle detection result and a scrubbing recipe corresponding to the estimated particle distribution is determined.

In the substrate processing control system of the invention, the scrubbing region setting unit may change a criterion for setting a scrubbing region depending on whether the precision or throughput of substrate processing is given priority.

Individual groups of particles on a substrate are preferably separately scrubbed when scrubbing is performed with precision being given priority, and a rather broad area is preferably scrubbed at once when scrubbing is performed with throughput being given priority. The invention allows a scrubbing region to be set depending on whether precision or throughput is given priority.

The substrate processing control system of the invention may comprise a simulator that simulates the particle distribution of a substrate and throughput to be achieved by scrubbing according to the scrubbing recipe and determines whether the scrubbing recipe is to be adopted or not based on the simulation result.

This configuration allows a determined scrubbing recipe to be checked and therefore can enhance the yield of scrubbing performed in accordance with the scrubbing recipe.

In the substrate processing control system of the invention, the model storage may hold a plurality of recipe generating models of different types, the scrubbing recipe generator may determine a plurality of scrubbing recipes using different recipe generating models, and the simulator may determine a single scrubbing recipe based on simulation results of a plurality of scrubbing recipes determined by using different recipe generating models.

This configuration allows scrubbing to be performed by using the best scrubbing recipe of a plurality of scrubbing recipes determined with different recipe generating models.

The substrate processing control system of the invention may comprise a learning unit for performing learning on the recipe generating model based on results of simulations performed on a plurality of scrubbing regions by the simulator. This can improve the accuracy of the recipe generating model for determining a scrubbing recipe.

The substrate processing control system of the invention may comprise a learning unit for performing learning on the recipe generating model based on a result of scrubbing actually performed according to the scrubbing recipe. Learning performed on the recipe generating model by using a result of actual scrubbing in this manner can improve the accuracy of the recipe generating model.

The substrate processing control system of the invention may have an actual result data storage holding a previously generated scrubbing recipe and data on the particle distribution of a substrate scrubbed by using the scrubbing recipe, and may read from the actual result data storage a predetermined number of scrubbing recipes approximate to the particle distribution estimated by the particle distribution estimation unit and, in the substrate processing control system, the simulator may determine a single scrubbing recipe based on simulation results of a plurality of scrubbing recipes.

This configuration allows the best scrubbing recipe to be selected from a predetermined number of proven scrubbing recipes used for substrates having approximate particle distributions, and therefore enables to omit a scrubbing recipe generation process.

The substrate processing control system of the invention may comprise an output unit for outputting a simulation result obtained by the simulator. This configuration allows for checking a simulation result of a determined scrubbing recipe.

In the substrate processing control system of the invention, the simulator may comprise a simulation model. The simulation model may be learned based on a result of scrubbing actually performed according to the scrubbing recipe. This allows for a precise prediction of a result of scrubbing performed in accordance with the scrubbing recipe.

The substrate processing control system of the invention may comprise a data receiver for receiving data on scrubbing transmitted from a plurality of substrate processing apparatuses connected to the data receiver via a network. This configuration allows a large amount of actual scrubbing data to be collected from a plurality of substrate processing apparatuses, and thus allows learning to be performed on the recipe generating model.

The substrate processing control method of the invention is a method of a controller controlling a polisher that locally polishes a substrate, and comprises the steps of: the controller measuring the film thickness of the substrate and estimating the film thickness distribution of the substrate based on the measurement result; the controller setting a local polishing region on the substrate based on the estimated film thickness distribution; the controller selecting a polishing head based on the size of the local polishing region; the controller reading from a storage a recipe generating model that defines the relation between an input node and an output node, the input node being an attribute of the local polishing region, the output node comprising a recipe for a polishing process; the controller putting an attribute of the local polishing region into the input node of the recipe generating model and determining a polishing recipe for polishing the local polishing region; and the controller transmitting data of the polishing recipe to a polisher that performs local polishing.

A substrate processing control method according to another aspect of the invention is a method of a controller controlling a scrubbing process for removing a foreign material existing on a substrate, and comprises the steps of: the controller detecting a particle on the substrate and estimating the particle distribution based on the detection result; the controller setting a scrubbing region on the substrate based on the particle distribution; the controller selecting a scrubbing member based on the size of the scrubbing region; the controller reading from a storage a recipe generating model that defines the relation between an input node and an output node, the input node being an attribute of the scrubbing region, the output node comprising a recipe for a scrubbing process; the controller putting an attribute of the scrubbing region into the input node of the recipe generating model and determining a scrubbing recipe for scrubbing the scrubbing region; and the controller transmitting data of the scrubbing recipe to a substrate processing apparatus that performs scrubbing.

A program of the invention is for controlling a polisher that locally polishes a substrate, and causes a computer to execute the steps of: measuring the film thickness of the substrate and estimating the film thickness distribution of the substrate based on the measurement result; setting a local polishing region on the substrate based on the estimated film thickness distribution; selecting a polishing head based on the size of the local polishing region; reading from a storage a recipe generating model that defines the relation between an input node and an output node, the input node being an attribute of the local polishing region, the output node comprising a recipe for a polishing process; putting an attribute of the local polishing region into the input node of the recipe generating model and determining a polishing recipe for polishing the local polishing region; and transmitting data of the polishing recipe to a polisher that performs local polishing.

A program according to another aspect of the invention is for controlling a scrubbing process for removing a foreign material existing on a substrate, and causes a computer to execute the steps of: detecting a particle on the substrate and estimating the particle distribution based on the detection result; setting a scrubbing region on the substrate based on the particle distribution; selecting a scrubbing member based on the size of the scrubbing region; reading from a storage a recipe generating model that defines the relation between an input node and an output node, the input node being an attribute of the scrubbing region, the output node comprising a recipe for a scrubbing process; putting an attribute of the scrubbing region set by a scrubbing region setting unit into the input node of the recipe generating model and determining a scrubbing recipe for scrubbing the scrubbing region; and transmitting data of the scrubbing recipe to a substrate processing apparatus that performs scrubbing.

A local polisher of the invention comprises: a local polishing unit for performing local polishing on a wafer to be processed by making a polished surface of the wafer to be processed and a polishing surface of a polishing member, the polishing surface being smaller than the polished surface, slide upon each other; a torque sensor for sensing torque generated to slide the polishing member during the local polishing; and a polishing condition modification unit for modifying a polishing condition of the local polishing using data on the torque during the local polishing and, in the local polisher, the local polishing unit performs the local polishing modifying the polishing condition during the local polishing.

Torque required to slide the polishing member changes depending on a surface condition of an object to be polished and on the position of a polishing head. Despite an attempt to keep the torque within a certain range, the torque increases if there are projections remaining larger than anticipated, and decreases if there are projections being lower than anticipated. This configuration of the invention allows for sensing torque data during local polishing and for dynamically modifying a polishing condition based on the torque data, and therefore allows local polishing to be performed appropriately without completely grasping the surface condition of the wafer at the start of polishing, so that time for measuring the surface condition of the wafer before the start of polishing can be reduced.

In the local polisher of the invention, the polishing condition modification unit may modify the polishing condition when an amount of change in the torque per unit time is greater than or equal to a predetermined threshold.

This configuration allows polishing to be performed in accordance with the torque by modifying a polishing condition when the torque changes sharply.

In the local polisher of the invention, the polishing condition modification unit may modify the polishing condition when the torque crosses a predetermined threshold.

This configuration allows local polishing to be performed with the torque not crossing a predetermined threshold. The conditional clause "when the torque crosses a predetermined threshold" includes both when the torque goes above a predetermined threshold and when the torque goes below a predetermined threshold. For example, when polishing is performed with a predetermined polishing condition, whether the torque is between first and second thresholds or not may be determined and the polishing condition may be modified when the torque goes below the first threshold or when the torque goes above the second threshold.

The local polisher of the invention may comprise a storage holding a recipe modification model that defines the relation between an input node and an output node, the input node being the torque, the output node being a polishing condition and, in the local polisher, the polishing condition modification unit may put the torque sensed by the torque sensor into the input node of the recipe modification model and may determine a polishing condition.

Using the recipe modification model in this way allows a polishing condition to be appropriately modified in accordance with the sensed torque.

In the local polisher of the invention, the recipe modification model may have the duration of service of the polishing member as an input node.

Since the duration of service of the polishing member reflects the degree of wear, deterioration, etc. of the polishing member, an appropriate polishing condition can be determined with the duration of service of the polishing member being an input node.

The local polisher of the invention may comprise a profile calculator for calculating the surface unevenness of the polished wafer based on the polishing condition and the torque during polishing.

This configuration allows the surface unevenness of a polished wafer to be determined by calculation, and therefore eliminates the need for an actual measurement of a wafer for determining whether the surface condition of the polished wafer meets a predetermined specification or not.

In the local polisher of the invention, an initial polishing condition may be set by predicting the surface condition of the wafer to be processed based on a condition of an upstream manufacturing process of the wafer to be processed or on a result of measuring the surface unevenness of the wafer to be processed.

Setting an initial polishing condition based on a prediction in this manner eliminates the need for a precise measurement of the unevenness of a wafer surface, and therefore realizes a quick local polishing. Since the torque is sensed and the polishing condition is dynamically changed during local polishing as described above, polishing can be performed appropriately even if the initial polishing condition is roughly set based on a prediction.

A local polishing method of the invention is a method of a local polisher performing local polishing on a wafer to be processed by making a polished surface of the wafer to be processed and a polishing surface of a polishing member, the polishing surface being smaller than the polished surface, slide upon each other, and the local polishing method comprises the steps of: the local polisher sensing torque generated to slide the polishing member during the local polishing; and the local polisher modifying a polishing condition of the local polishing using data on the torque during the local polishing and, in the local polishing method, the local polisher performs the local polishing modifying the polishing condition during the local polishing.

A program of the invention is for controlling a local polisher that performs local polishing on a wafer to be processed by making a polished surface of the wafer to be processed and a polishing surface of a polishing member, the polishing surface being smaller than the polished surface, slide upon each other, and the program causes the local polisher to execute the steps of: sensing torque generated to slide the polishing member during the local polishing; modifying a polishing condition of the local polishing using data on the torque during the local polishing; and performing the local polishing modifying the polishing condition during the local polishing.

A polisher of the invention comprises: an entire polishing unit for performing entire polishing on a wafer to be processed; a local polishing unit for performing local polishing on the wafer; a film thickness measurement unit for measuring the film thickness of the wafer; a film thickness distribution estimation unit for estimating the film thickness distribution of the wafer yet to be polished based on the film thickness measured by the film thickness measurement unit; and a local polishing region setting unit for setting a local polishing region on the wafer to be subjected to the local polishing based on the film thickness distribution and the planarization capability of the entire polishing.

Planarization capability is how much the difference in level of projections on a wafer surface can be eliminated by entire polishing, and this configuration allows a local polishing region to be determined with consideration for planarization capability and thus realizes local polishing that covers a region left unfinished by entire polishing. As a result, throughput of planarization of a wafer can be improved with entire and local polishing coupled with each other.

The polisher of the invention may comprise: a polishing head selection unit for selecting a polishing head based on the size of the local polishing region; a model storage holding a recipe generating model that defines the relation between an input node and an output node, the input node being an attribute of the local polishing region, the output node being a polishing condition; and a polishing recipe generator that puts an attribute of the local polishing region into the input node of the recipe generating model and generates a polishing recipe for the local polishing to be performed on the local polishing region. This configuration allows an appropriate polishing recipe to be determined in accordance with an attribute of a local polishing region.

The polisher of the invention may comprise a recipe generating model learning unit for performing learning on the recipe generating model with learning data being film thickness data obtained by the film thickness measurement unit measuring the film thickness of the wafer after the local polishing. This configuration allows learning to be performed on the recipe generating model based on the film thickness distribution obtained after local polishing.

In the polisher of the invention, the local polishing unit may perform local polishing on a subsequent wafer with a polishing recipe used for a previously processed wafer. This configuration eliminates the need for determining a polishing recipe for each wafer, and therefore can speed up the process.

In the polisher of the invention, the local polishing unit may be placed downstream or upstream of the entire polishing unit. The setting of a local polishing region with consideration for the planarization capability of entire polishing can be applied both to when entire polishing is performed in advance and to when local polishing is performed in advance.

A polishing method of the invention is of performing entire and local polishing on a wafer to be processed, and comprises the steps of: a polisher measuring the film thickness of the wafer; the polisher estimating the film thickness distribution of the wafer based on the film thickness of the wafer measured before polishing; the polisher setting a local polishing region on the wafer to be subjected to the local polishing based on the film thickness distribution and the planarization capability of the entire polishing; the polisher performing entire polishing on the wafer; and the polisher performing local polishing on the wafer.

A program of the invention is for controlling a polisher to perform entire and local polishing on a wafer to be processed, and causes the polisher to execute the steps of: measuring the film thickness of the wafer; estimating the film thickness distribution of the wafer based on the film thickness of the wafer measured before polishing; setting a local polishing region on the wafer to be subjected to the local polishing based on the film thickness distribution and the planarization capability of the entire polishing; performing entire polishing on the wafer; and performing local polishing on the wafer.

BRIEF DESCRIPTION OF THE DRAWINGS

FIG. 13 shows an example of actual result data of polishing recipes stored in a storage;

MODE OF EMBODYING THE INVENTION

Figure 1:
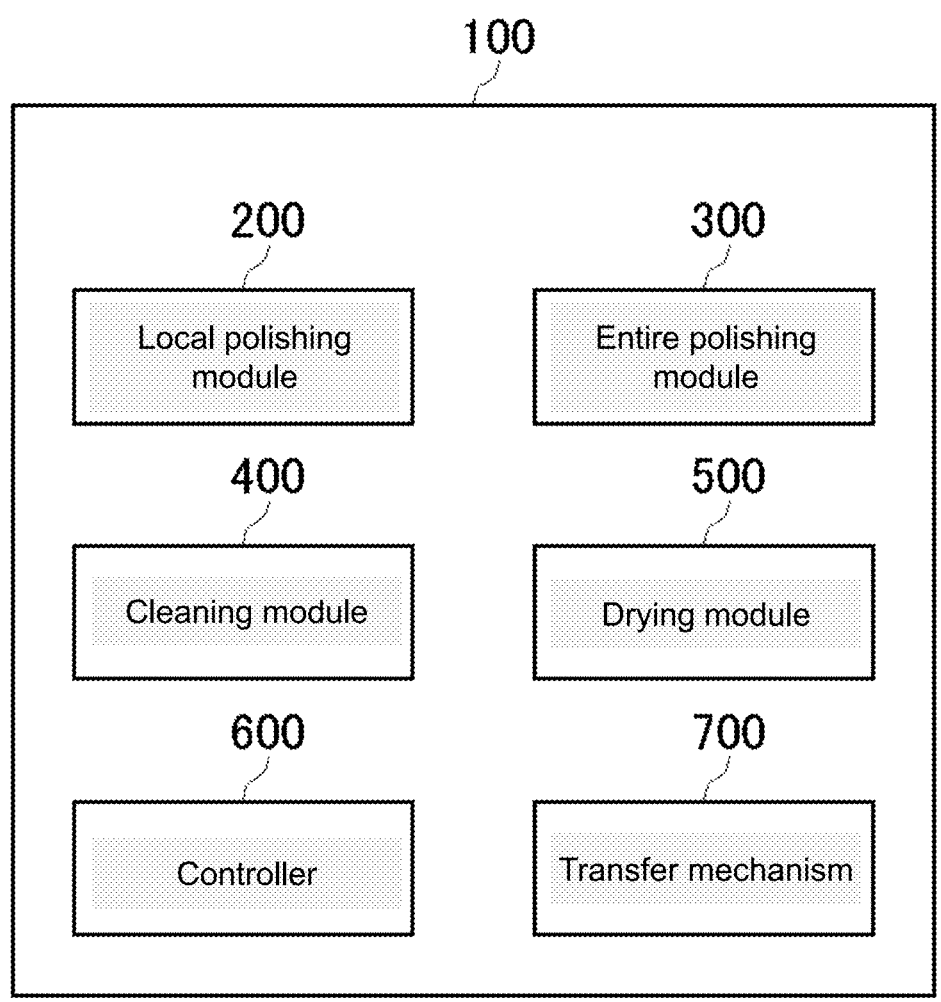
FIG. 1 is a block diagram showing a general configuration of a polisher according to an embodiment.

Now, polishers and polishing methods of embodiments of the invention will be described with reference to the drawings. An example of the polishers described below is a CMP apparatus. In the drawings, identical or similar reference symbols are used to designate identical or similar elements, and repeated description may be omitted. First to fourth embodiments cover a polisher as a substrate processing apparatus controlled by a substrate processing control system, and a scrubbing apparatus is covered and described in a fifth embodiment. A local polisher is described in a sixth embodiment, and a polisher is described in a seventh embodiment.

First Embodiment

Descriptions will be given first of a configuration a polisher for performing local polishing, and then of a control system of the polisher.

[General Configuration of Polisher]

FIG. 1 is a block diagram showing a general configuration of a polisher 100 according to an embodiment. As shown in FIG. 1, the polisher 100 has a local polishing module 200, an entire polishing module 300, a cleaning module 400, a drying module 500, a controller 600, and a transfer mechanism 700.

The local polishing module 200 uses a smaller polishing pad than a semiconductor wafer to be polished Wf (hereinafter referred to as the "wafer Wf") to polish the wafer Wf. A detailed configuration of the local polishing module 200 will be described later. The entire polishing module 300 uses a larger polishing pad than the wafer Wf to be polished to polish the wafer Wf. Any known entire polishing module can be used as the entire polishing module 300, which is therefore not described in detail herein.

The cleaning module 400 cleans the wafer Wf after polishing. The cleaning module 400 can clean the wafer Wf with any timing. For example, the cleaning can be done after each of local and entire polishing described later finishes, or after both of them finish. Any known cleaning module can be used as the cleaning module 400.

The drying module 500 dries the wafer Wf after cleaning. Any known drying module can be used as the drying module 500. The transfer mechanism 700 transfers the wafer Wf within the polisher 100, and it passes the wafer Wf between the local polishing module 200, the entire polishing module 300, the cleaning module 400, and the drying module 500.

The controller 600 controls the operation of each module of the polisher 100. The controller 600 can be made up of a common general-purpose computer, a dedicated computer, etc., and comprises hardware including a storage, an input/output device, a memory, and a CPU. The controller 600 controls the operations of the modules according to a program stored in the storage. The program realizing the controller 600 is included in the scope of the invention. The transfer mechanism 700 also transfers the wafer Wf into and out of the polisher 100. Any known transfer mechanism can be used as the transfer mechanism 700.

[Local Polishing Module]

Figure 2:
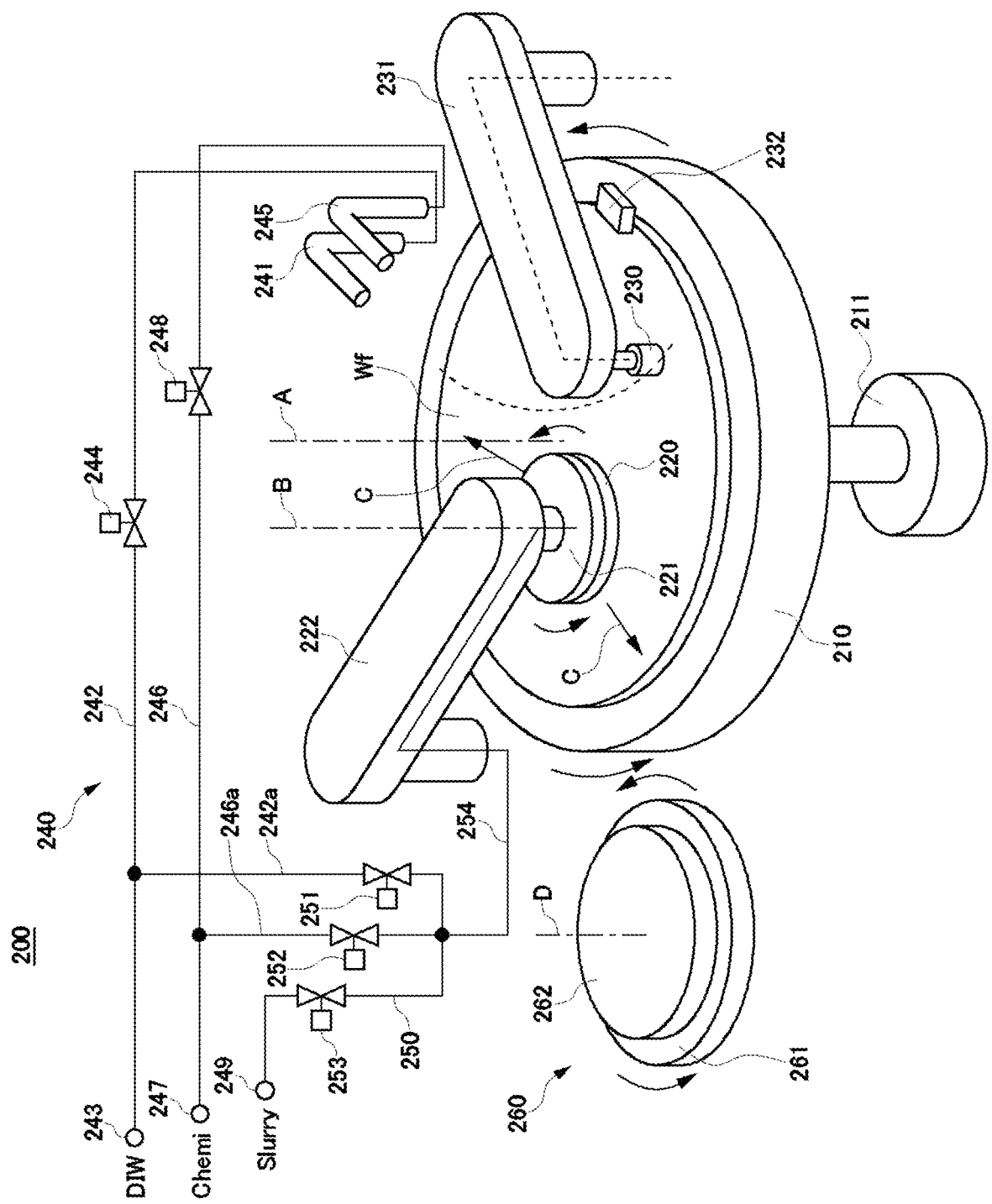
FIG. 2 shows a schematic configuration of an example of a local polishing module.

FIG. 2 shows a schematic configuration of an example of the local polishing module 200. A polishing pad 220 which is smaller in diameter than the wafer Wf to be processed is used in the local polishing module 200 shown in FIG. 2.

As shown in FIG. 2, the local polishing module 200 comprises a table 210 on which the wafer Wf is set, a head 221 mounted with the polishing pad 220 for processing a surface to be processed of the wafer Wf, an arm 222 holding the head 221, a processing liquid supply system 240 for supplying processing liquid, and a conditioner 260 for conditioning (setting) the polishing pad 220. The overall operation of the local polishing module 200 is controlled by the controller 600.

The polishing pad 220 is formed of, for example, an expanded polyurethane hard pad, a suede soft pad, sponge, or the like. As shown in FIG. 2, the diameter of the polishing pad 220 is smaller than the wafer Wf. In addition, the diameter of the polishing pad 220, Φ, is desirably equal to or smaller than the size of a region to be processed where the film thickness and/or shape is uneven. The diameter Φ is preferably smaller than or equal to 50 mm, and more preferably between 10 and 30 mm. The diameter Φ may be smaller than or equal to 10 mm when a region to be locally polished on or the amount to be eliminated from the wafer Wf is small enough so that the decrease in productivity can be accepted even if the speed at which the pad polishes the wafer Wf is low.

The table 210 has a mechanism for holding the wafer Wf by suction, and holds the wafer Wf. In the embodiment shown in FIG. 2, the table 210 can rotate around a rotation axis A by means of a drive mechanism 211. The table 210 may be made to use the drive mechanism 211 to cause the wafer Wf to rotate some angles, scroll, or stop at any position on the table 210 after rotation. A combination of these movements and a swing movement of the arm 222 described later allows the polishing pad 220 to move to any position on the wafer Wf. The polishing pad 220 is mounted on a surface of the head 221 that is opposite to the wafer Wf. The head 221 can rotate around a rotation axis B by means of a drive mechanism not shown in the figure.

The head 221 can press the polishing pad 220 against the surface to be processed of the wafer Wf by means of a mechanism not shown in the figure such as an air cylinder, a ball screw, or other actuators.

The arm 222 can move the head 221 within the radius or diameter of the wafer Wf as shown by arrows C. The arm 222 can also swing the head 221 to a position where the polishing pad 220 is opposed to the conditioner 260.

While the embodiment gives the example where there are one head 221 and one polishing pad 220 for the wafer Wf, the numbers of heads and polishing pads may be two or more. The head 221 may have a plurality of polishing pads within the head, where the sizes of the polishing pads may be different from one another. The local polishing module 200 may have a plurality of heads each having a polishing pad whose size is different from the others. The surface of the wafer Wf can be processed more efficiently by using these different heads or polishing pads depending on the area to be polished on the wafer Wf. Though not shown in the figure, the arm may be made to automatically select an appropriate head when the local polishing module 200 has a plurality of polishing pads.

The local polishing module 200 comprises a detecting head 230. The detecting head 230 is mounted with a detector for detecting the state of the polished surface of the wafer Wf. The detector may be a Wet-ITM (In-line Thickness Monitor), for example. A Wet-ITM can detect (measure) the film thickness distribution (or the distribution of information on the film thickness) of a film formed on the wafer Wf with the detecting head 230 existing on the wafer in a noncontact manner and moving across the whole surface of the wafer.

The detecting head 230 is held by an arm 231 and, moving along a track passing through the center of the wafer Wf by means of a rotation of the arm 231, detects the film thickness distribution of the wafer Wf.

Any type of detector other than the Wet-ITM can be used as the detector. For example, a noncontact-type detection method such as a known eddy-current-type or optical-type detection method can be adopted as an available detection method, and a contact-type detection method may be adopted.

A sensor 232 for sensing at least one of a notch, an orientation flat, and a laser marker formed on the wafer Wf as a reference position and to be placed out of contact with the wafer Wf may be provided within or without the local polishing module 200, and a rotation angle sensing mechanism may be mounted on the drive mechanism 211 so that the table 210 can be rotated a certain angle from a predetermined position.

The sensor 232 is placed so as not to rotate with the table 210. With the sensor 232 sensing the position of at least one of a notch, an orientation flat, and a laser marker on the wafer Wf, data including the film thickness detected by the detecting head 230 can be associated not only with the position in a radial direction but also with the position in a circumferential direction. That is, the placement of the wafer Wf at a predetermined position on the table 210 based on these indices related to the drive mechanism 211 and position of the wafer Wf allows for obtaining the distribution of the film thickness or of a signal related to the film thickness of the wafer Wf with reference to the reference position described above.

While in the embodiment the detecting head 230 is mounted independently of the arm 222, there may be a configuration in which the detecting head 230 is attached to the arm 222 and the film thickness or a signal related to the film thickness or to information on the height of projections and depressions is acquired by using the movement of the arm 222. A polishing endpoint may be determined for each polished region based on the film thickness or a signal related to the film thickness or to the height of projections and depressions acquired by the detecting head 230.

The conditioner 260 is a member for conditioning the surface of the polishing pad 220. The conditioner 260 comprises a dressing table 261, and a dresser 262 provided on the dressing table 261. The dressing table 261 can rotate around a rotation axis D by means of a drive mechanism not shown in the figure.

The processing liquid supply system 240 comprises a pure water nozzle 241 for supplying pure water (DIW) to the polished surface of the wafer Wf. The pure water nozzle 241 is connected via pure water piping 242 to a pure water supply source 243. The pure water piping 242 is provided with an on/off valve 244 capable of opening and closing the pure water piping 242. The controller 600 can control opening and closing of the on/off valve 244 to supply pure water to the polished surface of the wafer Wf with any timing.

The processing liquid supply system 240 comprises a chemical nozzle 245 for supplying chemical (Chemi) to the polished surface of the wafer Wf. The chemical nozzle 245 is connected via chemical piping 246 to a chemical supply source 247. The chemical piping 246 is provided with an on/off valve 248 capable of opening and closing the chemical piping 246. The controller 600 can control opening and closing of the on/off valve 248 to supply chemical to the polished surface of the wafer Wf with any timing.

The local polishing module 200 can selectively supply pure water, chemical, slurry (Slurry), or other polishing liquid via the arm 222, the head 221, and the polishing pad 220 to the polished surface of the wafer Wf. Specifically, branched pure water piping 242a branches off from a point on the pure water piping 242 between the pure water supply source 243 and the on/off valve 244. Branched chemical piping 246a branches off from a point on the chemical piping 246 between the chemical supply source 247 and the on/off valve 248. Polishing liquid piping 250 connected with the branched pure water piping 242a, the branched chemical piping 246a, and a polishing liquid supply source 249 joins a liquid supply piping 254.

The branched pure water piping 242a is provided with an on/off valve 251 capable of opening and closing the branched pure water piping 242a. The branched chemical piping 246a is provided with an on/off valve 252 capable of opening and closing the branched chemical piping 246a. The polishing liquid piping 250 is provided with an on/off valve 253 capable of opening and closing the polishing liquid piping 250. There may be a configuration in which the polishing liquid can be supplied from outside the head 221 to the wafer Wf in the same manner as the pure water and the chemical.

A first end of the liquid supply piping 254 is connected to the three piping systems, i.e. the branched pure water piping 242a, the branched chemical piping 246a, and the polishing liquid piping 250. The liquid supply piping 254 extends through the inside of the arm 222, the center of the head 221, and the center of the polishing pad 220. A second end of the liquid supply piping 254 opens into the polished surface of the wafer Wf. The controller 600 can control opening and closing of the on/off valves 251, 252, and 253 to supply at least one of the pure water, the chemical, and the slurry or other polishing liquid or a mixture of any combination of these liquids to the polished surface of the wafer Wf with any timing.

There have been described configurations of the polisher 100 comprising the local polishing module 200. A polishing control system of the embodiment for controlling the local polishing module 200 will be described next.

[Local Polishing Control System]

Figure 3:
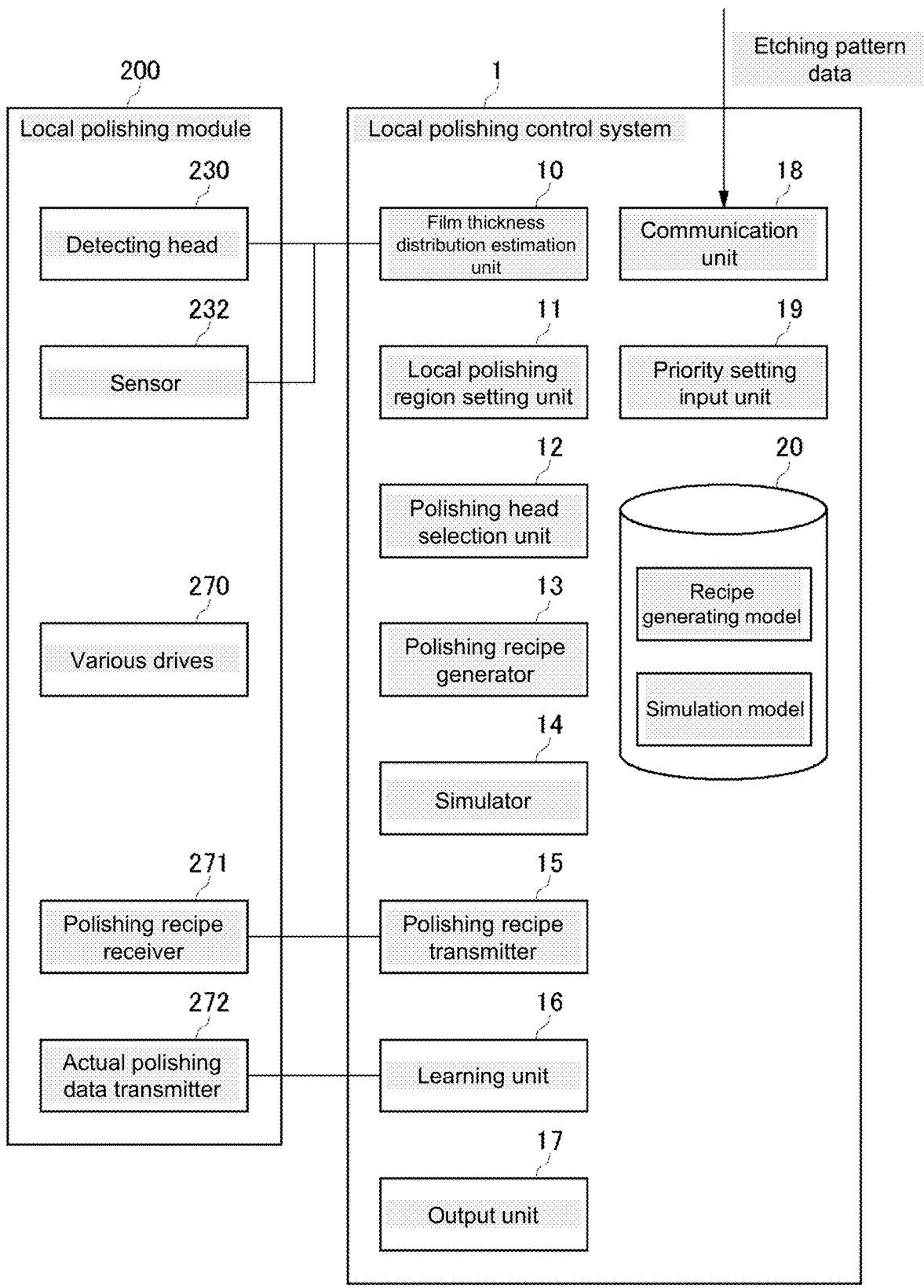
FIG. 3 shows a configuration of a local polishing control system for controlling the local polishing module.

FIG. 3 shows a configuration of a local polishing control system 1 for controlling the local polishing module 200. The local polishing control system 1 can be configured as part of the controller 600 described with FIG. 1. The local polishing control system 1 has a film thickness distribution estimation unit 10, a local polishing region setting unit 11, a polishing head selection unit 12, and a polishing recipe generator 13, as a configuration for generating a polishing recipe for local polishing.

The film thickness distribution estimation unit 10 has a function to estimate the film thickness distribution of a wafer to be locally polished. The film thickness distribution estimation unit 10 receives data of a result of measuring the film thickness of a wafer from the detecting head 230 and sensor 232 described above, and estimates the film thickness distribution of the wafer based on the received measurement result.

The local polishing control system 1 receives, via a communication unit 18, data on an etching pattern used upstream in an etching process. The film thickness distribution estimation unit 10 estimates the film thickness distribution using the data on the etching pattern as well. Since projections and depressions on the surface of the wafer Wf are affected by an underlying wiring pattern, the film thickness of a region not measured can be precisely complemented by using data on an etching pattern. The film thickness distribution estimation unit 10 estimates the film thickness distribution of a wafer in this manner, and therefore the detecting head 230 and the sensor 232 are not required to perform a precision measurement, so that the time required for the film thickness measurement can be reduced. While the embodiment gives a description of the example where the film thickness distribution is estimated by also using data on an etching pattern used in an upstream etching process, the use of data on an etching pattern is not essential, and the film thickness distribution estimation unit 10 may be configured to estimate the film thickness distribution only from data of a result of measuring the film thickness of a wafer.

Figure 4:
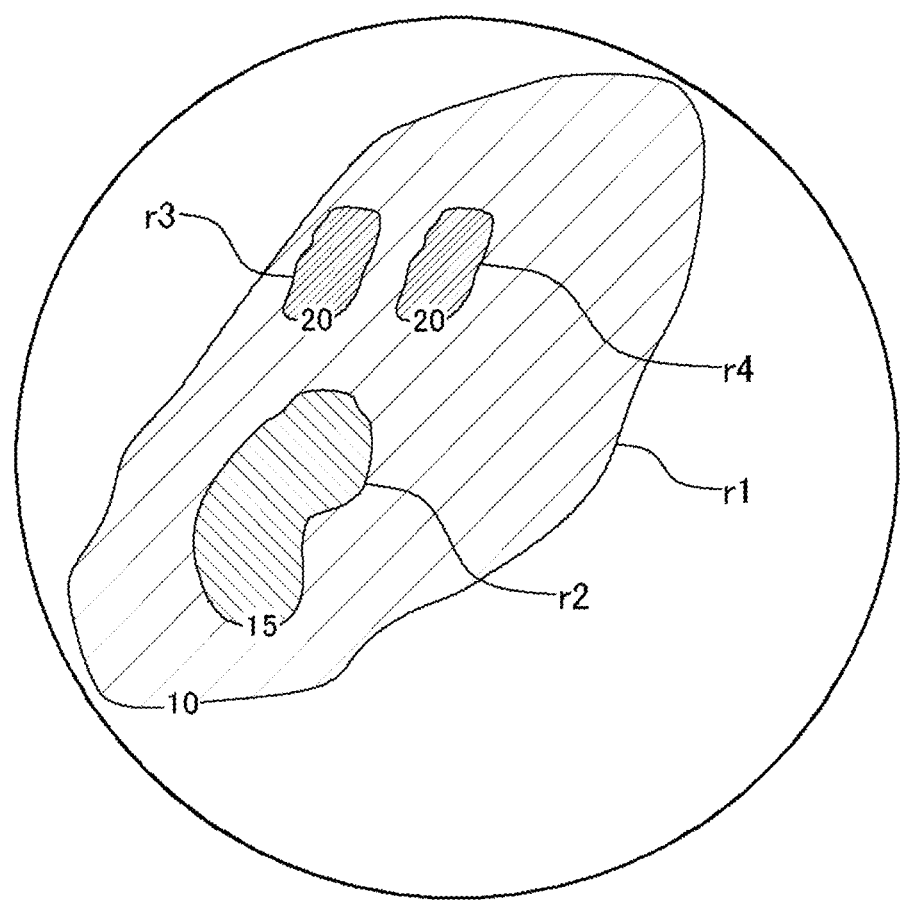
FIG. 4 is a contour plot showing a film thickness distribution estimated by a film thickness distribution estimation unit.

FIG. 4 is a contour plot showing a film thickness distribution estimated by the film thickness distribution estimation unit 10. In FIG. 4, the film thickness distribution is expressed by contour lines representing heights of 10, 15, and 20. The example shown in FIG. 4 has a region r1 enclosed by a contour line representing a height of 10, a region r2 enclosed by a contour line representing a height of 15, and two regions r3 and r4 enclosed by contour lines representing a height of 20. While in the FIG. 4 the contour plot is expressed in three different types of contour lines, how many levels the height is divided into can be set as appropriate. With the number of divisions determined, the film thickness distribution estimation unit 10 can calculate {(maximum height)−(minimum height)}/(number of divisions) to determine heights to be represented by contour lines.

The film thickness distribution estimated by the film thickness distribution estimation unit 10 is just an estimate. The model for determining a polishing recipe described later is a recipe generating model for generating a polishing recipe on the premise that the film thickness distribution is an estimate. An accurate polishing recipe can be determined from an estimate of the film thickness distribution by performing learning on the recipe generating model based on a result of local polishing actually performed by using a polishing recipe determined from the estimated film thickness distribution.

The local polishing region setting unit 11 has a function to set a local polishing region based on the film thickness distribution estimated by the film thickness distribution estimation unit 10. The local polishing region setting unit 11 sets a local polishing region differently depending on whether throughput or precision is given priority in performing local polishing. Whether throughput or precision is given priority in performing local polishing is set in advance by a user entering a command via a priority setting input unit 19.

Figure 5A:
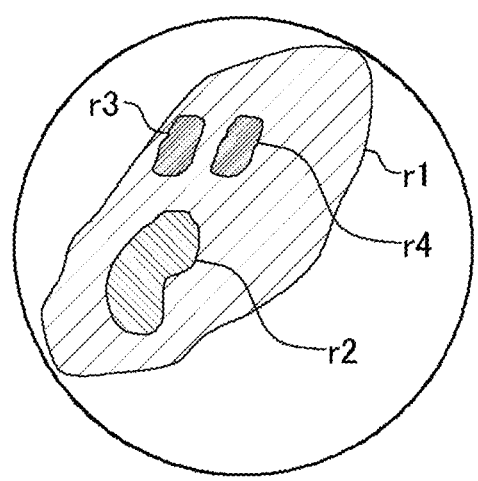
FIG. 5A shows an example of local polishing regions for local polishing to be performed with precision being given priority.
Figure 5B:
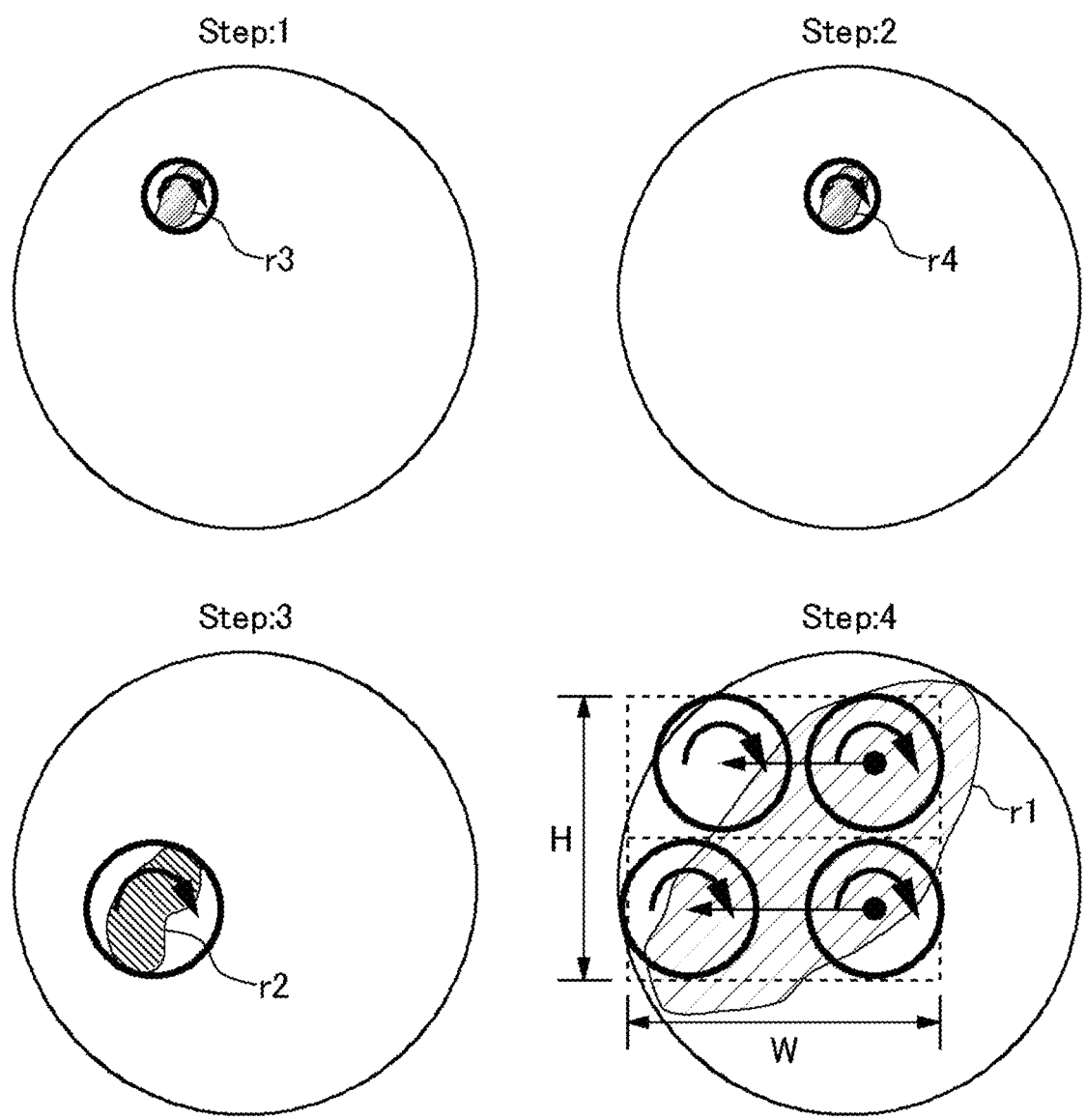
FIG. 5B shows an example of a procedure for local polishing to be performed with precision being given priority.
Figure 6A:
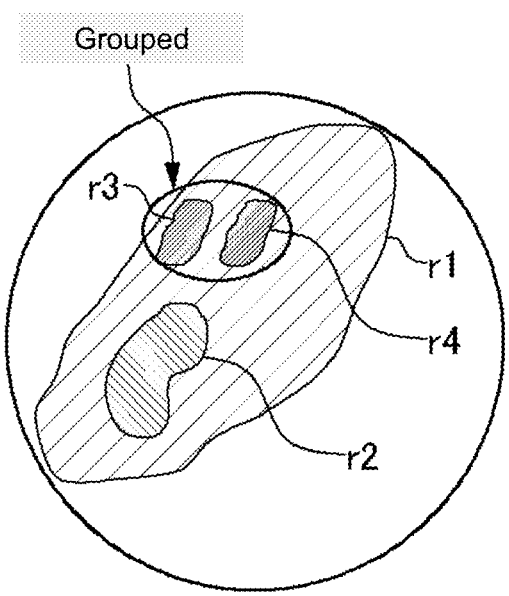
FIG. 6A shows an example of local polishing regions for local polishing to be performed with throughput being given priority.

FIG. 5A shows an example of local polishing regions for local polishing to be performed with precision being given priority. When local polishing is performed with precision being given priority, each of the regions r1 through r4 formed with the contour lines is set as a local polishing region as shown in FIG. 5A, and four steps are required to perform local polishing on all the regions as shown in FIG. 5B. FIG. 6A shows an example of local polishing regions for local polishing to be performed with throughput being given priority. When local polishing is performed with throughput being given priority, the adjacent regions r3 and r4 formed with the contour line representing a height of 20 are grouped into one local polishing region as shown in FIG. 6A. In this case, three steps will be enough for polishing all the local polishing regions as shown in FIG. 6B.

The polishing head selection unit 12 selects a polishing head based on the size of a local polishing region. FIG. 5B shows polishing heads to be used in the steps and their movements when local polishing regions are set as shown in FIG. 5A. A polishing head of a correct size to cover each of the local polishing regions r3, r4, and r2 is selected for each of the steps 1 through 3.

For the step 4, a polishing head of a size to efficiently perform local polishing is selected since no polishing head covers the local polishing region r1. Specifically, local polishing is performed on the region r1 by setting a rectangle scanning area (height H by width W) covering the local polishing region r1 to scan this scanning area with the polishing head.

Figure 6B:
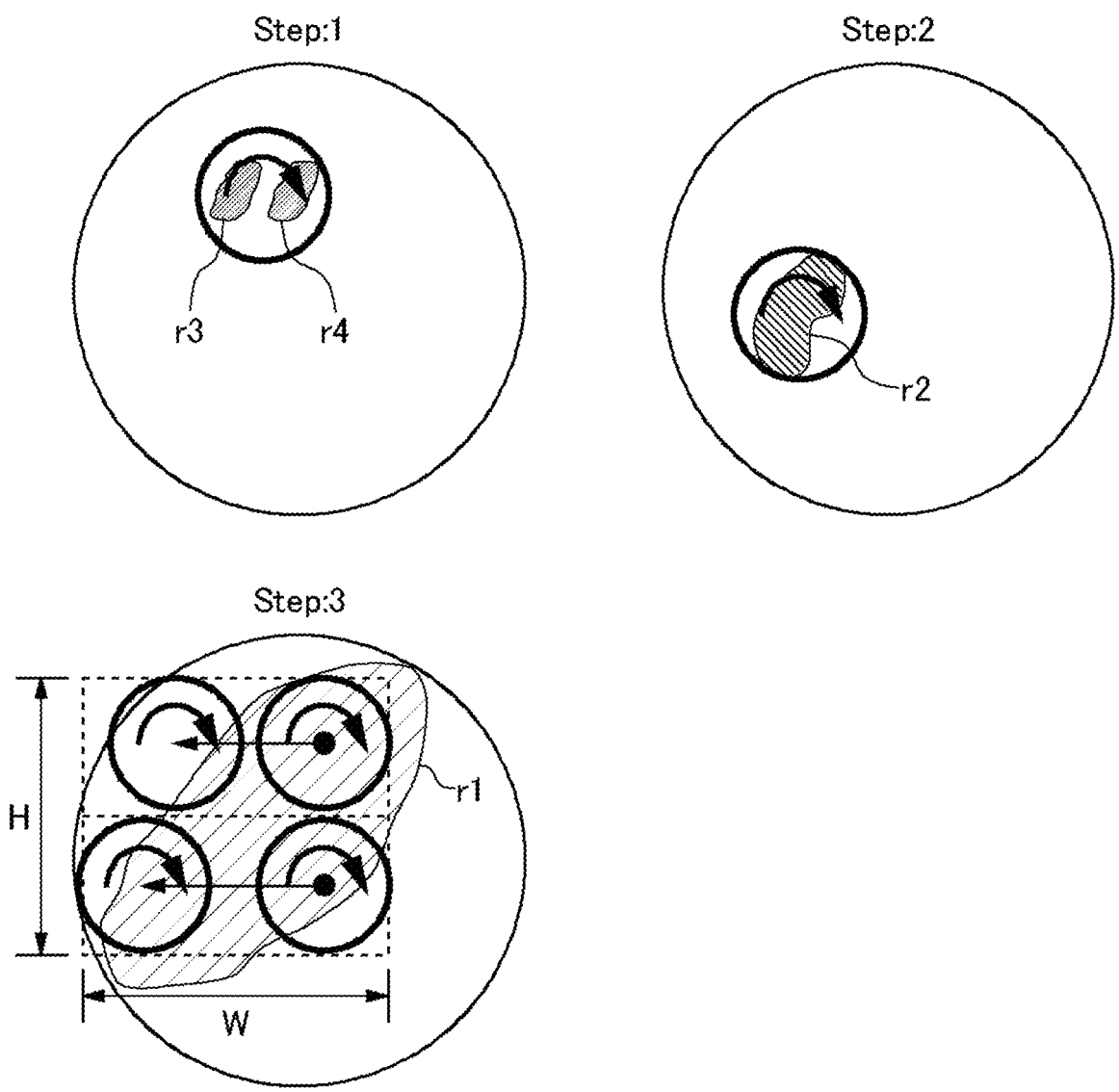
FIG. 6B shows an example of a procedure for local polishing to be performed with throughput being given priority.

FIG. 6B shows polishing heads to be used in the steps and their movements when local polishing regions are set as shown in FIG. 6A. Since the regions r3 and r4 are grouped into one local polishing region, a polishing head of a size to cover both regions r3 and r4 at once is selected in the step 1. The steps 2 and 3 are the same as the steps 3 and 4 shown in FIG. 5B.

In this way, local polishing can be performed appropriately by using small polishing heads to fit projections and depressions on the surface of the wafer Wf when priority is given to precision. In this case, polishing heads have to be changed according to the film thickness when local polishing is performed, and therefore throughput decreases in spite of the increase in precision. When priority is given to throughput, on the other hand, the polishing time can be reduced by polishing adjacent local polishing regions of the same height at once.

The polishing recipe generator 13 has a function to determine a polishing recipe for polishing a local polishing region. The polishing recipe generator 13 first determines an area covering a local polishing region with a polishing head. Describing with reference to FIG. 5B, polishing heads completely cover each local polishing region in the steps 1 through 3, and it is then only required to determine the positions of the polishing heads for polishing. The local polishing region in the step 4 is larger than its polishing head, and then the height H and width W of the rectangle scanning area covering the local polishing region are determined. A track of the polishing head for scanning the scanning area completely in a short time is then determined.

The polishing recipe generator 13 then determines other conditions for performing local polishing. Specifically, the polishing recipe generator 13 uses the recipe generating model to determine a polishing recipe according to an attribute of a local polishing region. A neural network model is used as the recipe generating model in the embodiment.

Figure 7:
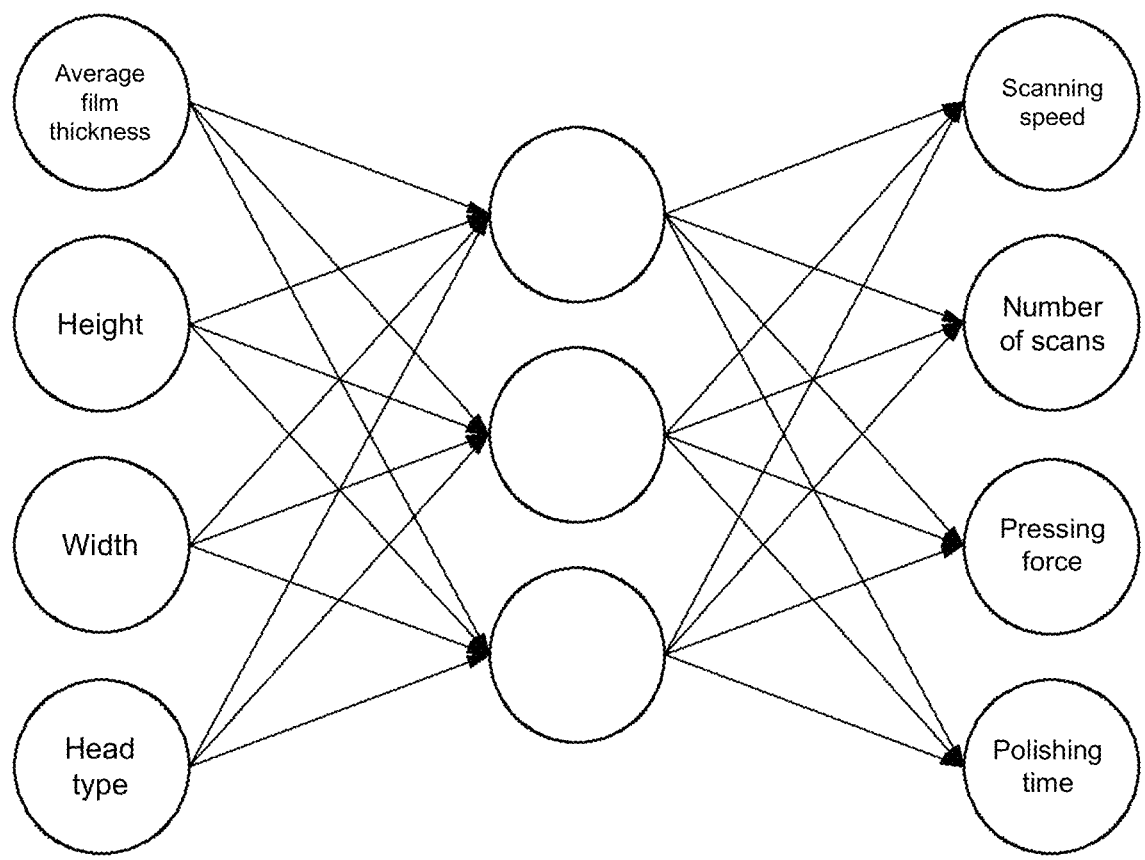
FIG. 7 shows an example of a recipe generating model stored in a storage.

FIG. 7 shows an example of the recipe generating model stored in a model storage 20. The recipe generating model has an attribute of a local polishing region and the like as input nodes, and conditions for performing polishing, i.e. a polishing recipe, as output nodes. The recipe generating model has nodes of the average film thickness of a local polishing region, the height and width of a scanning area, and a head type, as input nodes. The recipe generating model has nodes of a scanning speed, the number of scans, the pressing force of a polishing pad, and a polishing time, as output nodes. When it is not required to scan with a polishing head as in the steps 1 to 3 in FIG. 5B, input nodes of attributes, namely the height and width of a scanning area, and output nodes including a scanning speed and the number of scans are treated as nonexistent.

The recipe generating model shown in FIG. 7 is just an example, and input and output nodes of the model for determining a polishing recipe are not limited to those illustrated in FIG. 7. For example, the recipe generating model may have nodes of the speed of rotation of a polishing head, the supply rate of slurry, and the like as output nodes. Intermediate nodes between the input and output nodes may comprise not only one layer but also a plurality of layers.

The polishing recipe generator 13 puts attributes, namely the average film thickness of a local polishing region set by the local polishing region setting unit 11 and the height and width of a scanning area, into input nodes as well as a polishing head selected by the polishing head selection unit 12 to determine the values of the output nodes. In this manner, the polishing recipe generator 13 can determine a polishing recipe, i.e. the conditions for performing local polishing.

While in the embodiment a neural network model has been described as an example of the recipe generating model for determining a polishing recipe, not just a neural network model but also a decision tree model and a Bayesian network model can be used as a model for determining a polishing recipe.

Returning to FIG. 3, the description will be continued. The local polishing control system 1 comprises a simulator 14 for checking a polishing recipe generated by the polishing recipe generator 13. The simulator 14 simulates a film thickness distribution to be obtained by performing local polishing on a wafer in accordance with a polishing recipe.

The simulator 14 reads a simulation model stored in the model storage 20, puts the conditions of local polishing into the simulation model, and thus calculates a film thickness distribution to be obtained after the local polishing, and throughput. If as a result the film thickness distribution of the wafer to be obtained after the local polishing and the throughput meet predetermined specifications, the simulator 14 determines that the generated polishing recipe is acceptable. If as a result of simulation the film thickness distribution or the throughput does not meet a predetermined specification, the simulator 14 determines that the polishing recipe is unacceptable.

A polishing recipe transmitter 15 has a function to transmit data of a polishing recipe determined to be acceptable by the simulator 14's check to the local polishing module 200. Upon receiving the polishing recipe transmitted from the local polishing control system 1 via a polishing recipe receiver 271, the local polishing module 200 operates various drives 270 to perform local polishing in accordance with the received polishing recipe.

The various drives 270 are drives for driving the polisher 100 described with reference to FIG. 2 and include, for example, the drive mechanism 211 for the table 210, a drive mechanism for the arm 222, a rotary drive mechanism for rotating the polishing pad 220, an actuator for pressing the polishing pad 220 against a wafer, and the on/off valves 244, 248, and 251 to 253 of the processing liquid supply system 240.

After performing local polishing on a wafer in accordance with a polishing recipe, the local polishing module 200 measures a film thickness and transmits the measured film thickness data from an actual polishing data transmitter 272 to the local polishing control system 1. Upon receiving the film thickness data transmitted from the local polishing module 200, the local polishing control system 1 performs learning on the neural network model using the received film thickness data as a teaching signal. This allows for a continuous increase in the accuracy of the recipe generating model based on actual polishing data.

The local polishing control system 1 also has an output unit 17. The output unit 17 comprises, for example, a display or other indicating means. The local polishing control system 1 outputs, for example, a simulation result obtained by the simulator 14 from the output unit 17. This allows for a grasp of which part of a wafer is insufficiently polished, how much polishing is further required to meet predetermined specifications, or the like when a simulation result is unacceptable. Consequently, a polishing recipe can be modified, or the neural network model for determining a polishing recipe can be adjusted.

Figure 8:
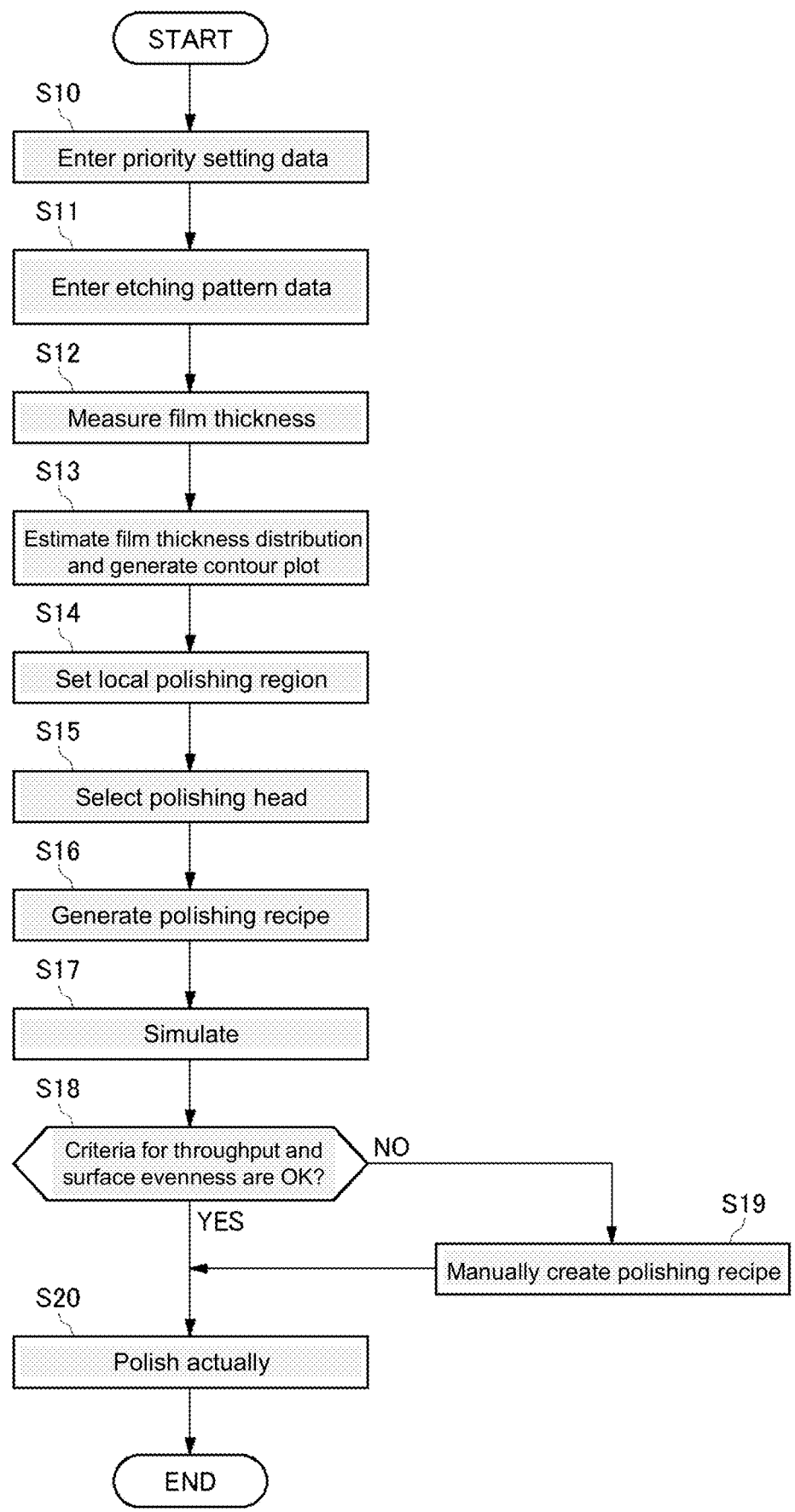
FIG. 8 shows an operation of the local polishing control system controlling local polishing.

FIG. 8 shows an operation of the local polishing control system 1 controlling local polishing. The local polishing control system 1 accepts an entry for priority setting on whether priority is given to precision or throughput when local polishing is performed (S10).

The local polishing control system 1 receives data on an etching pattern of a wafer to be locally polished via the communication unit (S11). The local polishing control system 1 measures the film thickness of the wafer to be locally polished (S12), estimates the film thickness distribution based on the film thickness measurement result and the etching pattern, and generates a contour plot (S13). The local polishing control system 1 then sets local polishing regions based on the estimated film thickness distribution (S14). The local polishing region setting unit 11 sets the local polishing regions based on whether the priority setting entered in advance is for precision or throughput.

The local polishing control system 1 then, based on the sizes of the local polishing regions, selects a polishing head for polishing each local polishing region (S15). After that, the local polishing control system 1 reads the recipe generating model for generating a recipe from the model storage 20, puts attributes of a local polishing region and the type of a polishing head into the recipe generating model, and thus generates a polishing recipe for polishing the local polishing region (S16).

The local polishing control system 1 then simulates a film thickness to be obtained by polishing the local polishing region using the generated polishing recipe (S17). From the simulation result, the local polishing control system 1 determines whether throughput satisfies a criterion and the film thickness to be obtained by polishing satisfies a criterion for the surface evenness or not (S18). If as a result the criteria are determined to be satisfied (YES at S18), the local polishing control system 1 transmits the polishing recipe to the local polishing module 200, and the wafer is actually polished (S20).

If as a result of the simulation the criteria for throughput and surface evenness are not satisfied (NO at S18), a polishing recipe is manually generated (S19) and actual polishing is performed with the generated polishing recipe (S20).

When the determination on whether the criteria for throughput and surface evenness are satisfied or not (S18) is made, whether throughput satisfies the criterion or not may be determined for each local polishing region, or may be determined based on the total polishing time to be spent on polishing all the local polishing regions.

There have been described configurations and operations of the local polishing control system 1 of the first embodiment. The local polishing control system 1 of the first embodiment generates a polishing recipe on the basis of a film thickness estimated by the film thickness distribution estimation unit 10, and can therefore generate a polishing recipe without a precise measurement of the film thickness of a wafer, so that a wafer can be locally polished in a short time.

The local polishing control system 1 of the first embodiment sets a local polishing region on the basis of the priority setting, and can therefore perform local polishing with precision or throughput being given priority.

Second Embodiment

Figure 9:
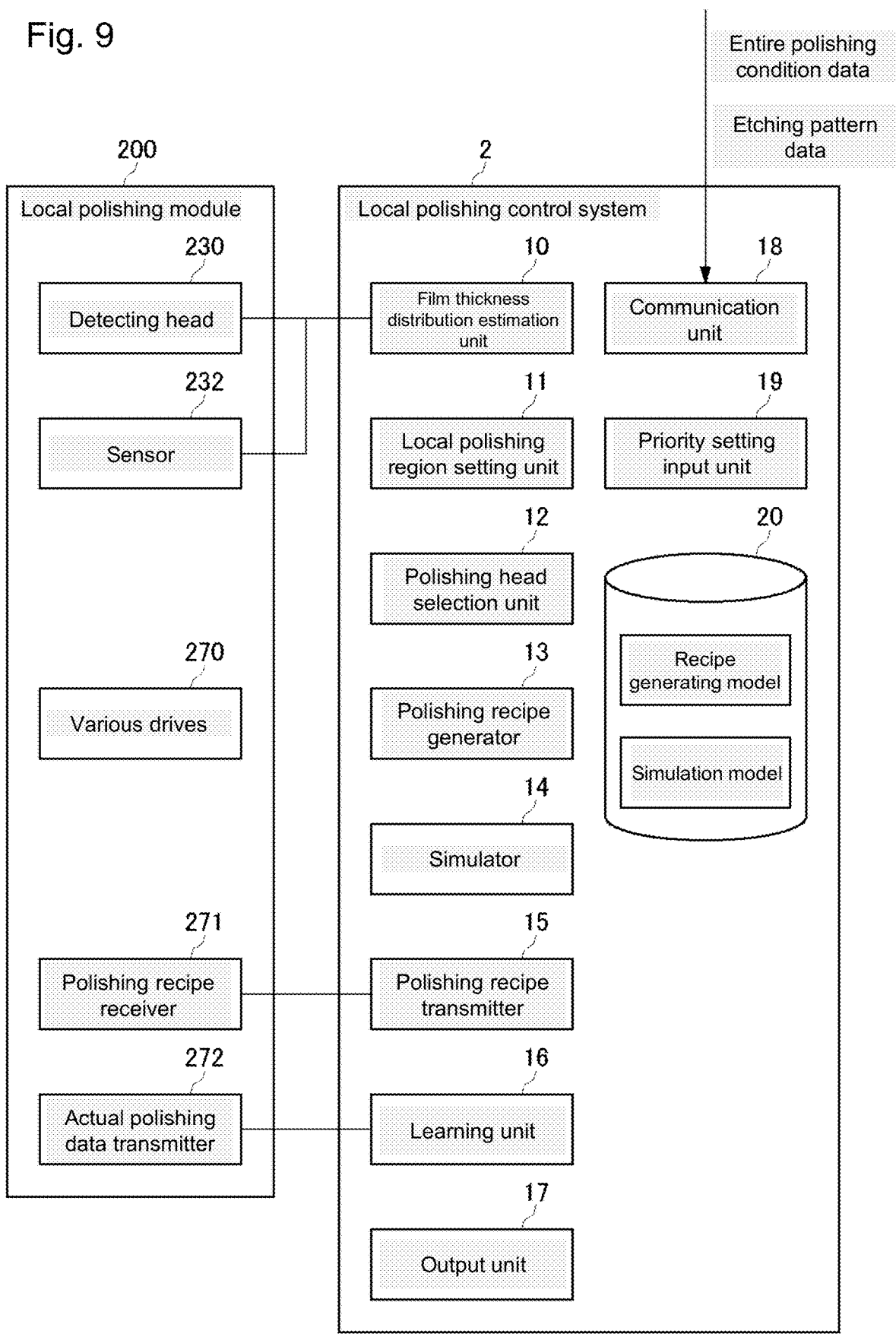
FIG. 9 shows a configuration of a local polishing control system of a second embodiment.

FIG. 9 shows a configuration of a local polishing control system 2 of a second embodiment. The polisher 100 has the entire polishing module 300 as well as the local polishing module 200 as described with reference to FIG. 1, and the local polishing control system 2 of the second embodiment uses a polishing condition for performing polishing with the entire polishing module 300 (which is referred to as an "entire polishing condition") as well to determine a local polishing recipe.

The local polishing control system 2 of the second embodiment receives data of an entire polishing condition via the communication unit 18. There are various conditions of entire polishing and, in the embodiment, data on the polishing time of entire polishing and the pressing force at the time of polishing are received.

Figure 10:
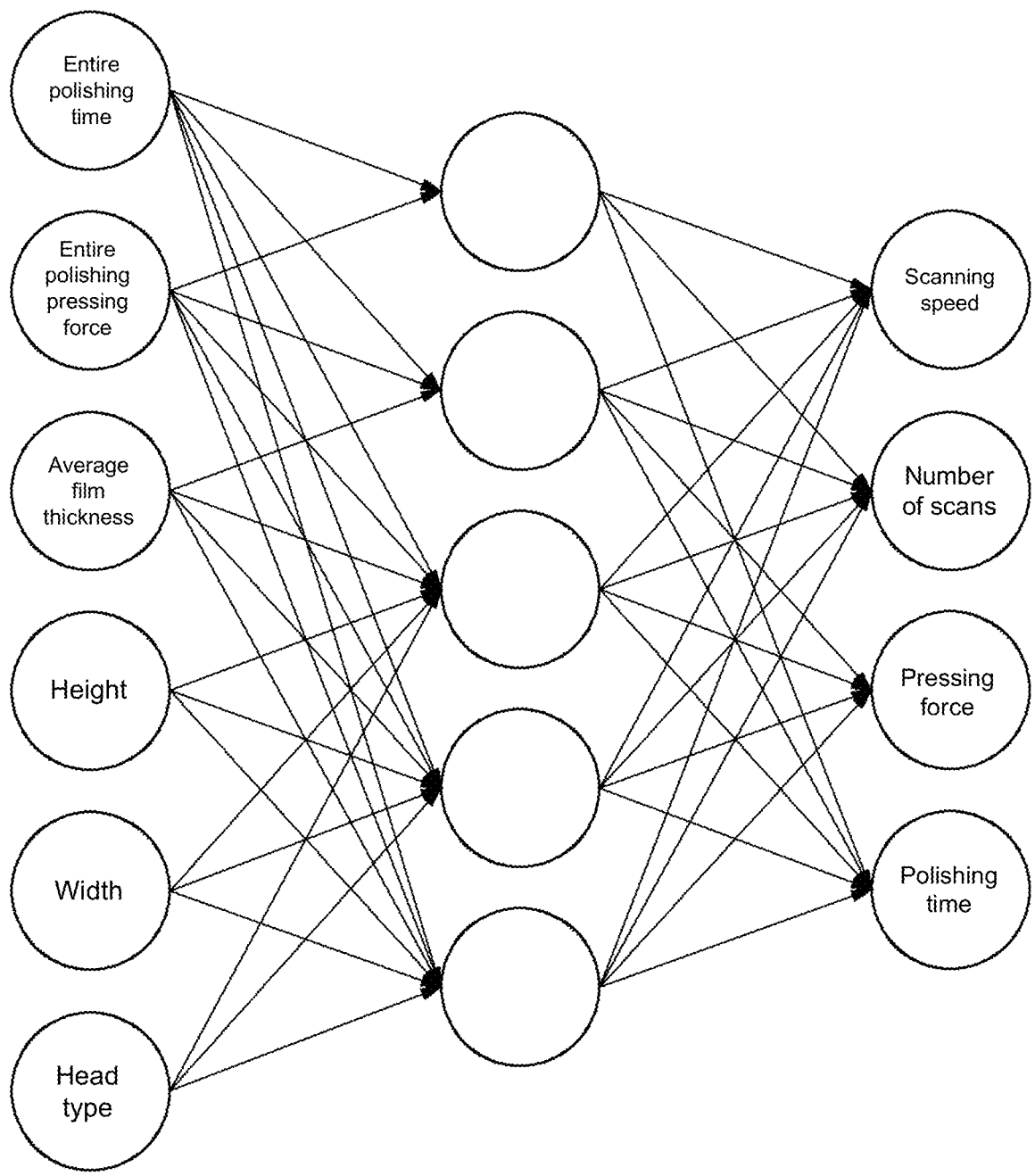
FIG. 10 shows an example of a recipe generating model used in the second embodiment.

FIG. 10 shows an example of a recipe generating model used in the second embodiment. The recipe generating model is like that in the first embodiment. The recipe generating model has nodes of an entire polishing time and an entire polishing pressing force as input nodes in addition to those of the recipe generating model described in the first embodiment. The local polishing control system 2 of the second embodiment puts attributes of a local polishing region and data on a polishing head to be used for local polishing into input nodes as well as data on the polishing time and pressing force of entire polishing received via the communication unit 18 to generate a polishing recipe for the local polishing.

The rest of the configuration of the local polishing control system 2 of the second embodiment is the same as the configuration of the local polishing control system 1 of the first embodiment. The operation of the local polishing control system 2 of the second embodiment is the same as that of the local polishing control system 1 of the first embodiment except that data of entire polishing conditions as well as an etching pattern are entered in the step S11 (FIG. 8) for entering etching pattern data.

The local polishing control system 2 of the second embodiment can generate an appropriate local polishing recipe into which entire and local polishing are combined, with consideration for the planarization capability of entire polishing as well. The local polishing control system 2 of the second embodiment can be used regardless of whether entire or local polishing is performed in advance.

Third Embodiment

Figure 11:
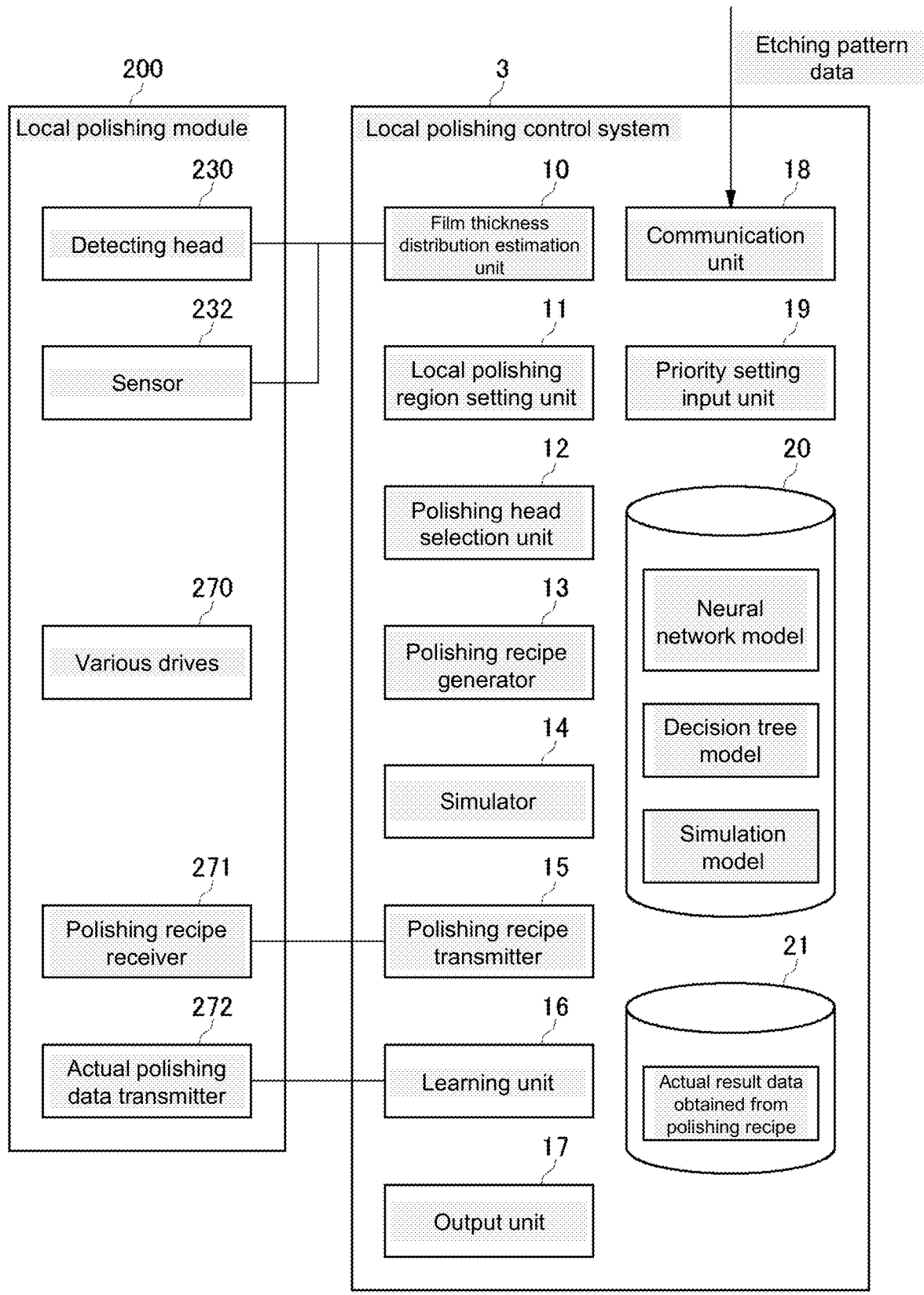
FIG. 11 shows a configuration of a local polishing control system of a third embodiment.

FIG. 11 shows a configuration of a local polishing control system 3 of a third embodiment. The local polishing control system 3 of the third embodiment has a configuration in which the polishing recipe generator 13 does not generate a polishing recipe based only on a recipe generating model but a best polishing recipe is selected from among polishing recipes generated with different types of models and previously used polishing recipes.

Figure 12:
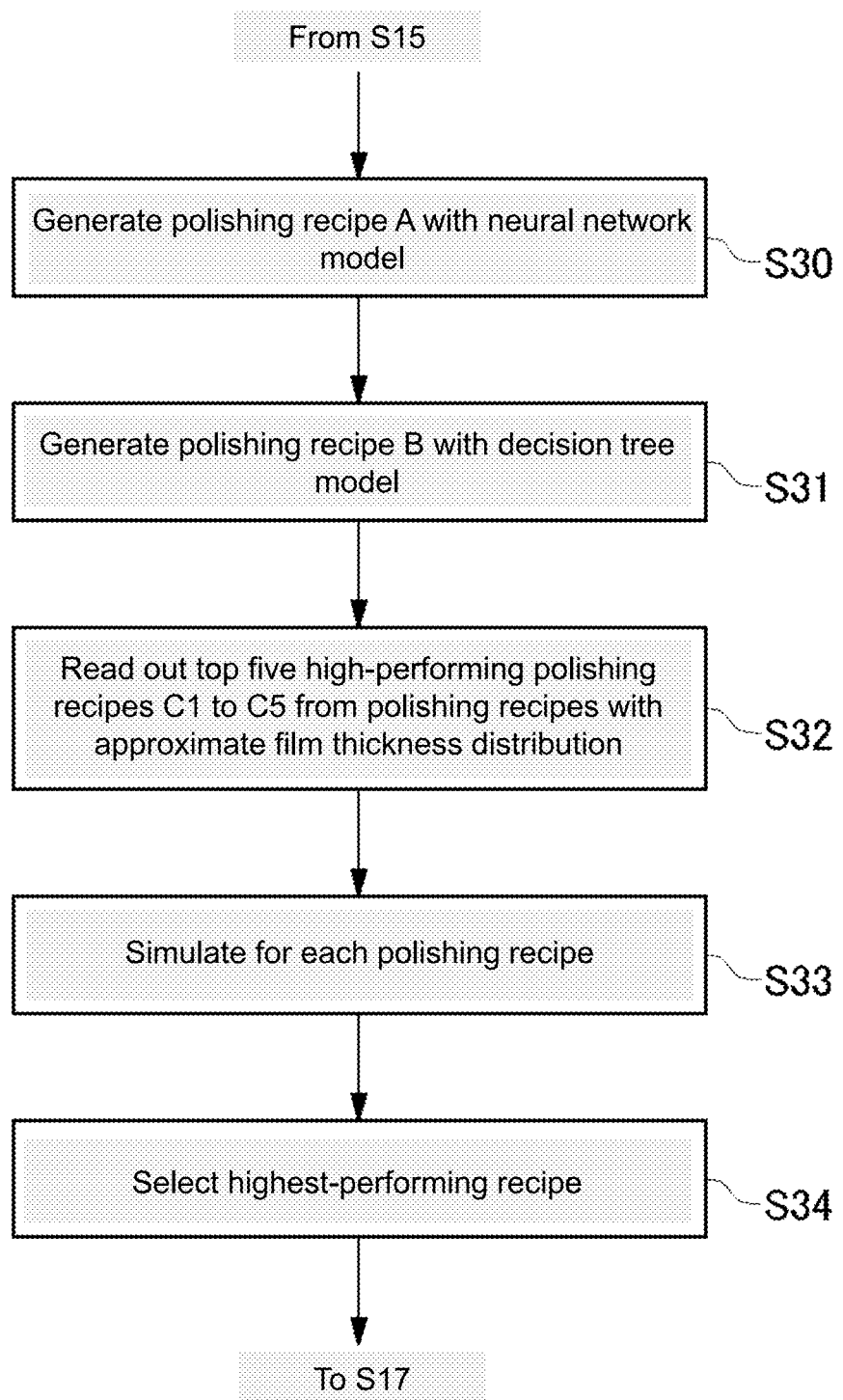
FIG. 12 is a flowchart showing an operation of the local polishing control system of the third embodiment generating a polishing recipe.

FIG. 12 is a flowchart showing an operation of the local polishing control system 3 of the third embodiment generating a polishing recipe. The flowchart in FIG. 12 corresponds to the processes of the steps S16 and S17 in the flowchart shown in FIG. 8. Generation of a polishing recipe will be described also with reference to FIG. 12.

A neural network model and a decision tree model are held as recipe generating models in the model storage 20 of the local polishing control system 3. The polishing recipe generator 13 puts attributes of a local polishing region etc. into input nodes of the neural network recipe generating model to determine a polishing recipe (which is referred to as the "polishing recipe A") (S30), and puts attributes of the local polishing region etc. into the decision tree model to determine a polishing recipe (which is referred to as the "polishing recipe B") (S31).

The local polishing control system 3 of the third embodiment has an actual result data storage 21 holding actual result data obtained from a previously used polishing recipe. FIG. 13 shows an example of actual result data of polishing recipes stored in the actual result data storage 21. Attributes of a previously polished local polishing region, a polishing recipe used for the local polishing region, and performance data after polishing are stored as actual result data. Data items of attributes of a local polishing region include the film thickness of the local polishing region, and the height and width of the scanning area. Though not shown in detail in FIG. 13, conditions included in a polishing recipe are, for example, the pressing force of polishing, the speed of rotation of a polishing head, a scanning speed, and a polishing time. Performance is a data item of a score to which the degree of surface evenness of a film thickness distribution after polishing, time taken to perform polishing, and the like are converted by a predetermined calculating formula. Actual result data described above are just examples, and data other than those described above may be stored as actual result data.

The polishing recipe generator 13 selects high-performing polishing recipes from actual result data (S32). Specifically, clustering is performed on actual result data by means of attributes of a local polishing region, and top five high-performing polishing recipes (which are referred to as the "polishing recipes C1 to C5") are selected from among actual result data included in a cluster approximate to attributes of a local polishing region to be processed.

The polishing recipe generator 13 simulates a film thickness distribution to be obtained by polishing, with the polishing recipes A, B, and C1 to C5 generated or selected as described above, the local polishing region to be processed (S33). The highest-performing polishing recipe is then selected (S34).

Such selection of a highest-performing polishing recipe from among polishing recipes generated with different models and previous polishing recipes increases the possibility of generating a polishing recipe that meets specifications because, even when one technique can only generate a polishing recipe incapable of meeting specifications, a polishing recipe obtained by using another technique also becomes a candidate.

While the embodiment has been described with the example in which a best recipe is selected from among polishing recipes generated by using different types of recipe generating models and previously used polishing recipes, a polishing recipe may be selected either from polishing recipes generated by using different types of recipe generating models or from previous polishing recipes.

Fourth Embodiment

Figure 14:
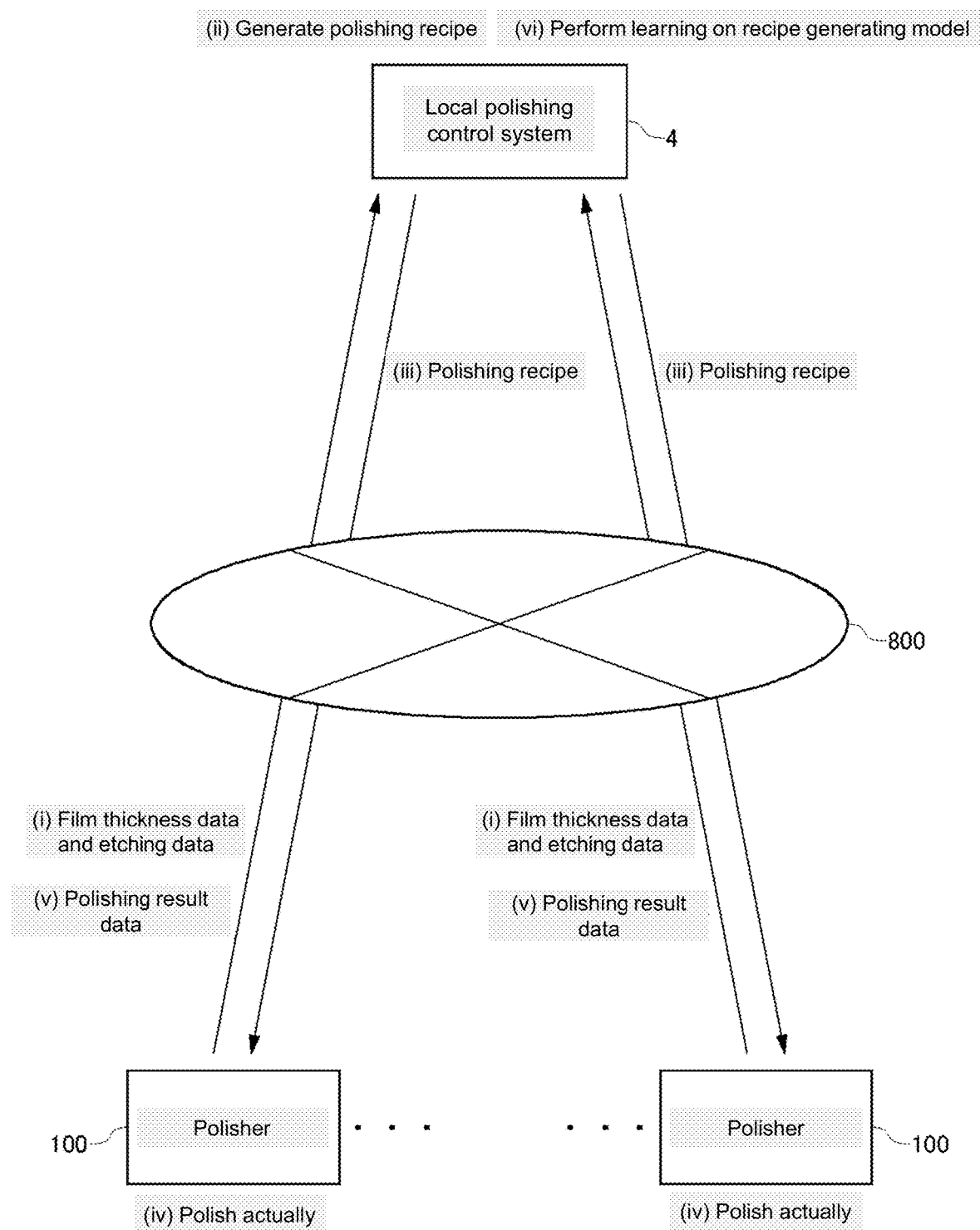
FIG. 14 shows a configuration of a local polishing control system of a fourth embodiment.

FIG. 14 shows a configuration of a local polishing control system 4 of a fourth embodiment. The configuration of the local polishing control system 4 of the fourth embodiment is basically the same as that of the local polishing control system 1 of the first embodiment described above. The local polishing control system 4 of the fourth embodiment, however, is connected via a network 800 such as the Internet to multiple polishers 100, so that it has a so-called IoT (Internet of Things) configuration.

The local polishing control system 4 of the fourth embodiment receives film thickness data of a wafer Wf to be processed or the like from a polisher 100 connected via the network 800 to the local polishing control system 4, and generates and distributes a local polishing recipe suited to the wafer Wf. The local polishing control system 4 also performs learning on a recipe generating model for determining a polishing recipe, based on data of local polishing results obtained by multiple polishers 100.

A flow of the provision of a polishing recipe and the learning performed on the recipe generating model will be described. A polisher 100 connected to the network 800 transmits film thickness data of a wafer to be processed and etching pattern data to the local polishing control system 4 (step (i)). Upon receiving the film thickness data and the etching data, the local polishing control system 4 generates a polishing recipe (step (ii)) and transmits the generated polishing recipe to the polisher 100 (step (iii)) in the same manner as the local polishing control system 1 of the first embodiment. The polisher 100 uses the polishing recipe received from the local polishing control system 4 to polish the wafer (step (iv)), and transmits data on the film thickness of the wafer after the polishing and data on time taken to perform the polishing to the local polishing control system 4 as polishing result data (step (v)). Upon receiving the polishing result data derived from the polishing recipe, the local polishing control system 4 uses the data to perform learning on the recipe generating model (step (vi)).

Figure 15A:
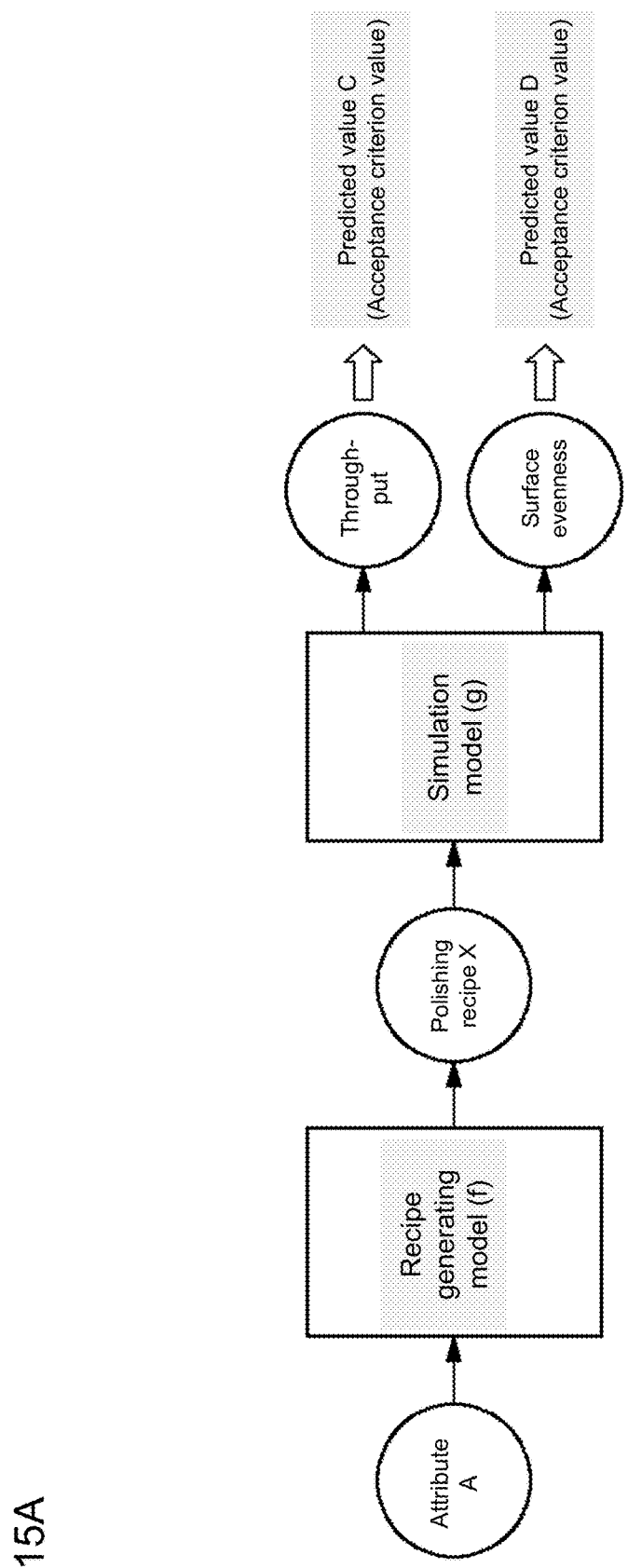
FIG. 15A illustrates an example where learning is performed on a recipe generating model by using polishing result data, and shows how a polishing recipe X is generated from an attribute A of a wafer to be processed and how a result to be obtained from polishing according to the polishing recipe X is obtained by simulation.
Figure 15B:
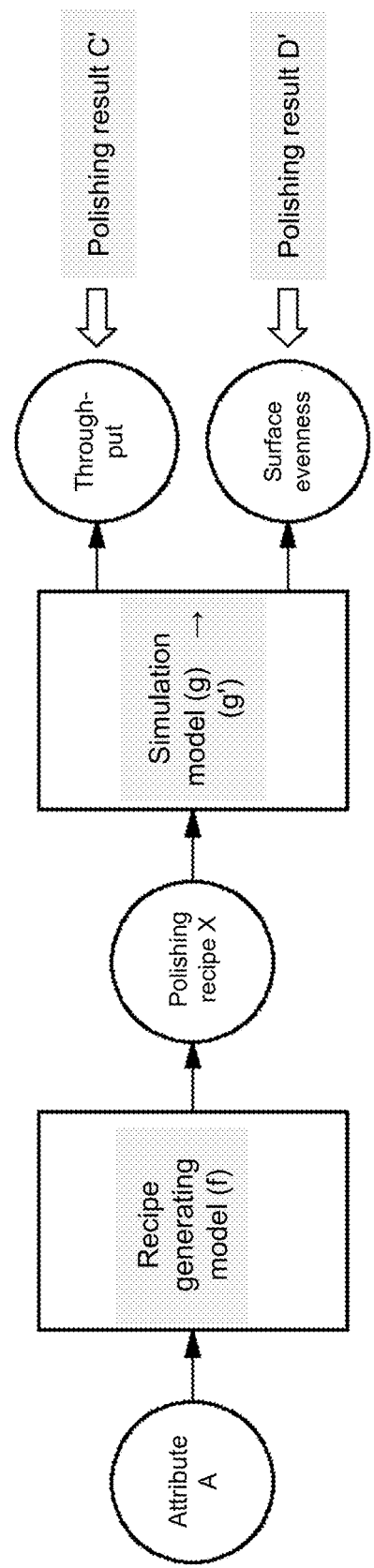
FIG. 15B illustrates an example where learning is performed on a recipe generating model by using polishing result data, and shows an example where learning is performed on a simulation model by means of polishing result data obtained by actual polishing.
Figure 15C:
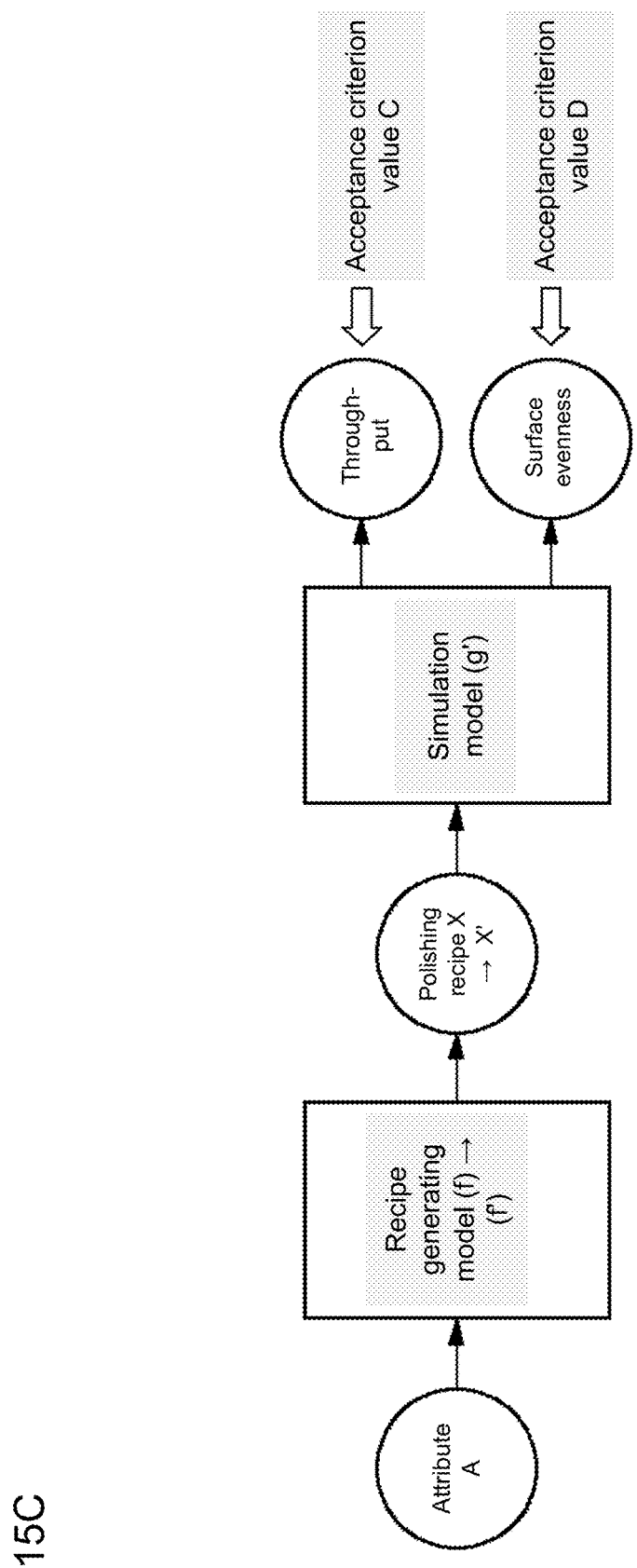
FIG. 15C illustrates an example where learning is performed on a recipe generating model by using polishing result data, and shows how a polishing recipe X' capable of obtaining acceptance criterion values C and D is obtained by using a simulation model (g') obtained by learning.

FIGS. 15A to 15C show an example of a technique to use the polishing result data to perform learning on the recipe generating model. In FIGS. 15A to 15C, the recipe generating model for determining a polishing recipe and a simulation model for simulating a polishing result using a polishing recipe are illustrated in a simplified manner.

FIG. 15A shows how a polishing recipe X is generated from an attribute A of a wafer to be processed (there are a plurality of nodes actually as shown in FIG. 7) by using a yet-to-be-learned recipe generating model (f) and how a result to be obtained from polishing according to the polishing recipe X is obtained by a simulation using a simulation model (g). A predicted value C for throughput and a predicted value D for surface evenness are obtained as simulation results in FIG. 15A. Assume that these predicted values C and D meet acceptance criteria for throughput and surface evenness and the obtained result is that the polishing recipe X can be used for actual polishing (YES at the step S18 in FIG. 8).

FIG. 15B shows an example where learning is performed on the simulation model by means of polishing result data obtained by actual polishing. When actual polishing has resulted in a polishing result C' whose throughput is different from the predicted value C and a polishing result D' whose surface evenness is different from the predicted value D, learning is performed on the simulation model (g) so that these results C' and D' can be obtained by the polishing recipe X to obtain a simulation model (g'). This is considered to have increased the simulation model's accuracy of predicting a polishing result from a polishing recipe.

Subsequently, as shown in FIG. 15C, a polishing recipe X' capable of obtaining the acceptance criterion values C and D is determined by using the simulation model (g') obtained by learning, and then learning is performed on the recipe generating model (f) so that the polishing recipe X' can be obtained to obtain a recipe generating model (f'). In this way, learning is performed on the recipe generating model for generating a polishing recipe.

Figure 15D:
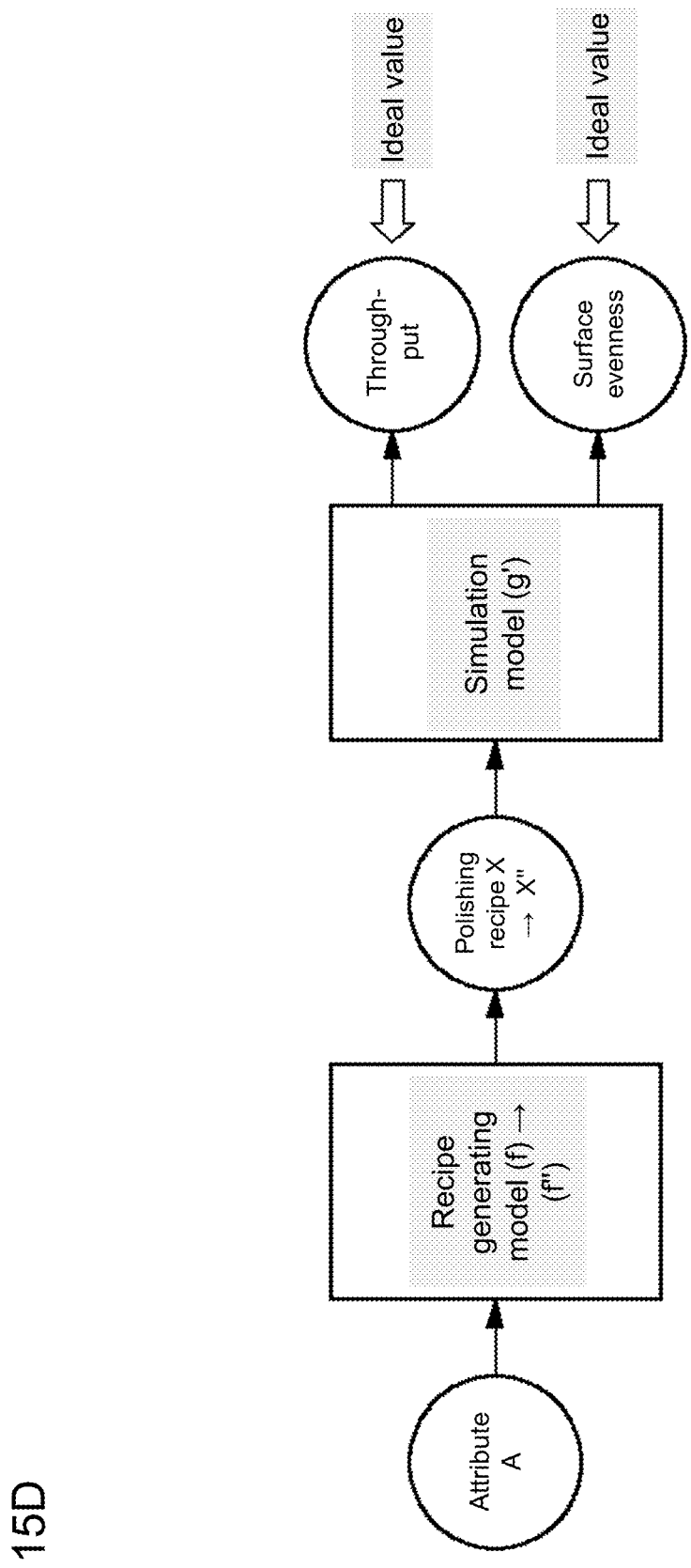
FIG. 15D illustrates an example where learning is performed on a recipe generating model by using polishing result data, and shows how ideal values for throughput and surface evenness are used to perform learning on the recipe generating model (f) to obtain a recipe generating model (f")

The learning described with reference to FIGS. 15A to 15C is just an example of learning performed on the recipe generating model, and the learning may be performed with another method. For example, ideal values for throughput and surface evenness may be used, in place of the acceptance criterion values C and D used in the process shown in FIG. 15C, to perform learning on the recipe generating model (f) to obtain a recipe generating model (f'') as shown in FIG. 15D.

The learning performed on the recipe generating model by using data of results of polishing performed by multiple polishers 100 connected via a network allows for determining an accurate polishing recipe for locally polishing a region to be polished, in accordance with such items as attributes of the region to be polished.

Fifth Embodiment

Local polishing of a wafer is an example of substrate processing, and a system for that has been described in the above embodiment, whereas this fifth embodiment will cover scrubbing of a wafer as an example of substrate processing and there will be given a description of a scrubbing control system for controlling a scrubbing apparatus that scrubs and removes foreign materials existing on a wafer Wf. First, a configuration of a scrubbing apparatus will be described.

[Configuration of Scrubbing Apparatus]

Figure 16:
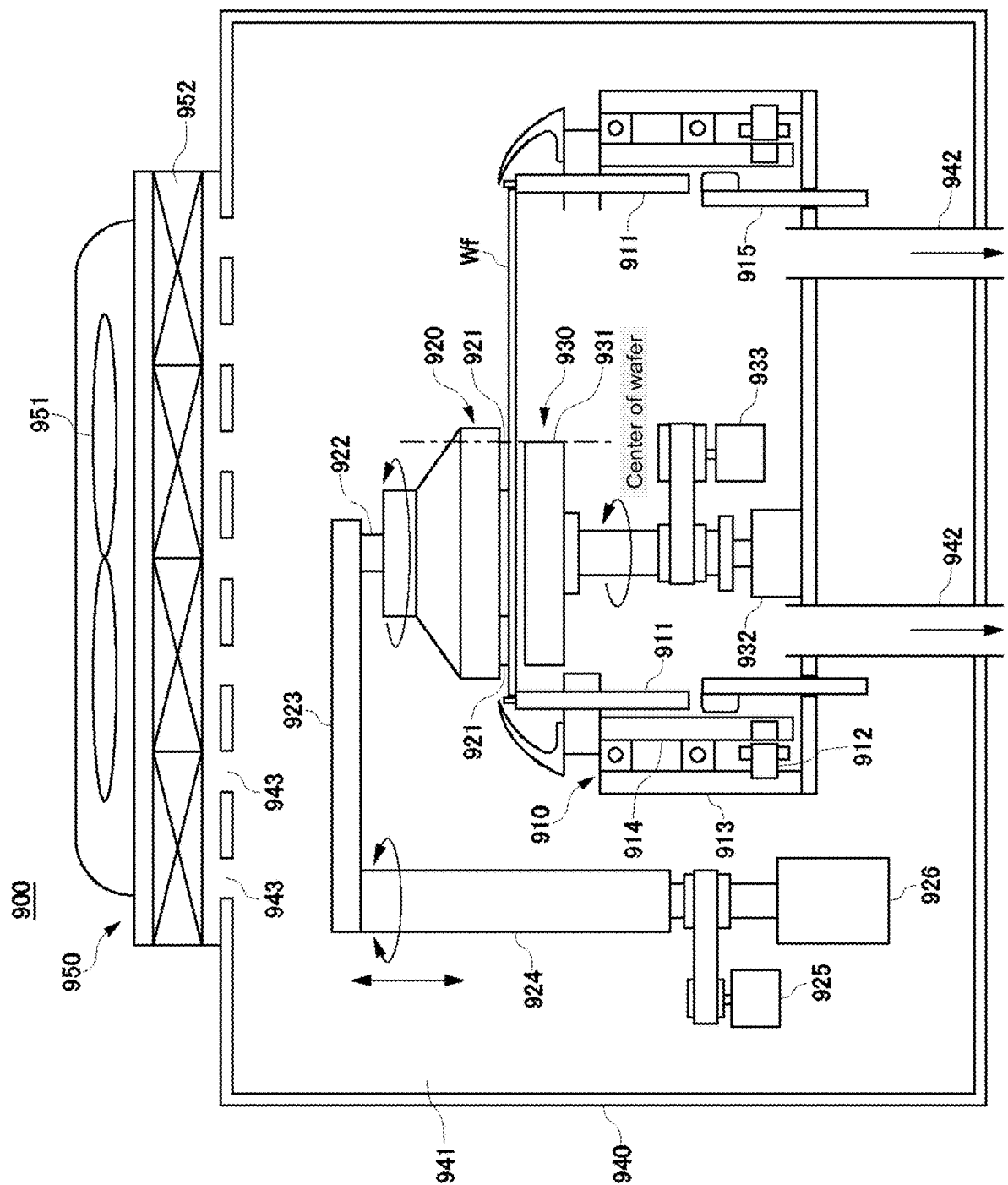
FIG. 16 is a side view showing a configuration of a scrubbing apparatus.

FIG. 16 is a side view showing a configuration of a scrubbing apparatus 900. As shown in FIG. 16, the scrubbing apparatus 900 comprises: a hollow-structured substrate rotation mechanism 910 for holding a wafer Wf horizontally and rotating it around its axis; a scrubber (processing head) 920 for scrubbing (performing scrub cleaning on) the upper surface of the wafer Wf held by the substrate rotation mechanism 910 to remove foreign materials and scratches from the upper surface of the wafer Wf; and a static pressure support mechanism 930 for supporting the undersurface of the wafer Wf by fluid pressure in a noncontact manner. The substrate rotation mechanism 910, the scrubber 920, and the static pressure support mechanism 930 are enclosed by a bulkhead 940. The internal space of the bulkhead 940 constitutes a processing room 941. The description given here focuses on a scrubbing process, but cleaning and drying can be done within this processing room 941, too, and the scrubbing apparatus 900 shown in FIG. 16 can also serve as a cleaning apparatus and a drying apparatus.

The static pressure support mechanism 930 is placed within the internal space of the substrate rotation mechanism 910. The static pressure support mechanism 930 comprises a support stage 931 supported by a stage elevating mechanism 932. The static pressure support mechanism 930 further comprises a stage rotation mechanism 933.

The scrubber 920 is placed above the wafer Wf held by the substrate rotation mechanism 910. The scrubber 920 comprises a scrubbing member 921 formed of a sponge, a nonwoven fabric, expanded polyurethane, or other soft material, or a polishing tape etc. for performing surface treatment on the wafer Wf. The surface treatment using the scrubbing member 921 is a process in which a foreign material is removed from the surface of the wafer Wf and/or at least part of a material constituting the surface of the wafer Wf is removed, by slightly paring off the surface of the wafer Wf. The surface treatment of the wafer Wf using the scrubbing member 921 is called a scrubbing (scrub cleaning) process.

The scrubber 920 is linked via a scrubber shaft 922 to one end of a swing arm 923, other end of which is fixed to a swing shaft 924. The swing shaft 924 is linked to a shaft rotation mechanism 925. This shaft rotation mechanism 925 drives the swing shaft 924, causing the scrubber 920 to move between a treatment position and a retracted position outside the wafer Wf in a radial direction.

The swing shaft 924 is further linked with a scrubber elevating mechanism 926 for moving the scrubber 920 up and down. This scrubber elevating mechanism 926 moves the scrubber 920 up and down via the swing shaft 924 and the scrubber shaft 922. The scrubber 920 is moved down into contact with the upper surface of the wafer Wf by the scrubber elevating mechanism 926. An air cylinder, a combination of a servomotor and a ball screw, or the like are used as the scrubber elevating mechanism 926.

A clean air intake 943 is formed on the upper part of the bulkhead 940, and a discharge duct 942 is formed on the lower part of the bulkhead 940. A discharge mechanism 950 is installed on the top surface of the bulkhead 940. This discharge mechanism 950 comprises a fan 951, and a filter 952 for removing particles and dust in air sent from the fan 951. The discharge mechanism 950 sends clean air through the clean air intake 943 to the processing room 941, and lets out gas of the processing room 941 thorough the discharge duct 942.

The substrate rotation mechanism 910 generally has a cylindrical shape, in the center of which a space is formed. The substrate rotation mechanism 910 comprises a plurality of chucks 911 for grasping the periphery of the wafer Wf, and a hollow motor 912 for rotating the wafer Wf by means of these chucks 911. A lifting mechanism 915 for lifting the chucks 911 is provided below the chucks 911. The hollow motor 912 is rotatably supported between a static member 913 and a rotary base 914 by an angular contact ball bearing.

[Scrubbing Control System]

Figure 17:
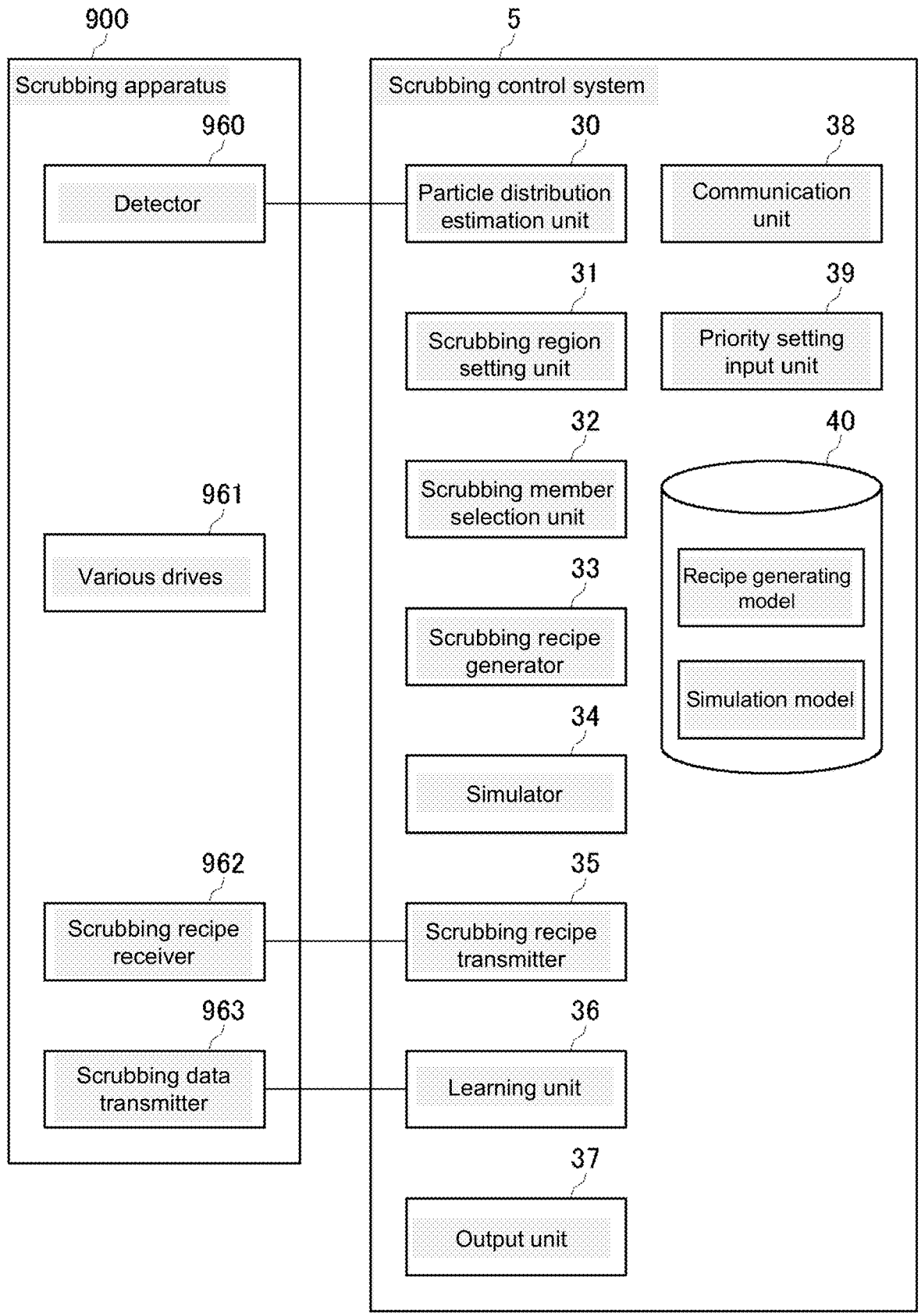
FIG. 17 shows a configuration of a scrubbing control system.

FIG. 17 shows a configuration of a scrubbing control system. A scrubbing control system 5 has a particle distribution estimation unit 30, a scrubbing region setting unit 31, a scrubbing member selection unit 32, and a scrubbing recipe generator 33, as a configuration for generating a scrubbing recipe for scrubbing.

The particle distribution estimation unit 30 has a function to estimate the particle distribution of a wafer to be scrubbed. The particle distribution estimation unit 30 receives data of a result of detecting particles on a wafer from a detector 960 for detecting particles on a wafer, and estimates the particle distribution of the wafer based on the received detection result. Since the particle distribution estimation unit 30 estimates the distribution of particles on a wafer in this manner, the detector 960 is not required to perform a precision detection, so that the time required for the particle detection can be reduced.

The scrubbing region setting unit 31 has a function to set a scrubbing region based on the particle distribution estimated by the particle distribution estimation unit 30. The scrubbing region setting unit 31 sets a scrubbing region differently depending on whether throughput or precision is given priority in performing scrubbing. Whether throughput or precision is given priority in performing scrubbing is set in advance by a user entering a command via a priority setting input unit 39.

The scrubbing member selection unit 32 selects a scrubbing member based on the size of a scrubbing region. When priority is given to precision, scrubbing can be performed appropriately by using a small scrubbing member to fit the distribution of particles existing on the surface of the wafer Wf, so that excessive scrubbing of an area without particles is prevented. When priority is given to throughput, on the other hand, the scrubbing time can be reduced by scrubbing adjacent scrubbing regions at once.

The scrubbing recipe generator 33 has a function to determine a scrubbing recipe for scrubbing a scrubbing region. The scrubbing recipe generator 33 first determines an area covering a scrubbing region with a scrubbing member. The scrubbing recipe generator 33 then determines other conditions for performing scrubbing. Specifically, the scrubbing recipe generator 33 uses a recipe generating model to determine a scrubbing recipe according to an attribute of a scrubbing region. A neural network model is used as the recipe generating model in the embodiment.

Figure 18:
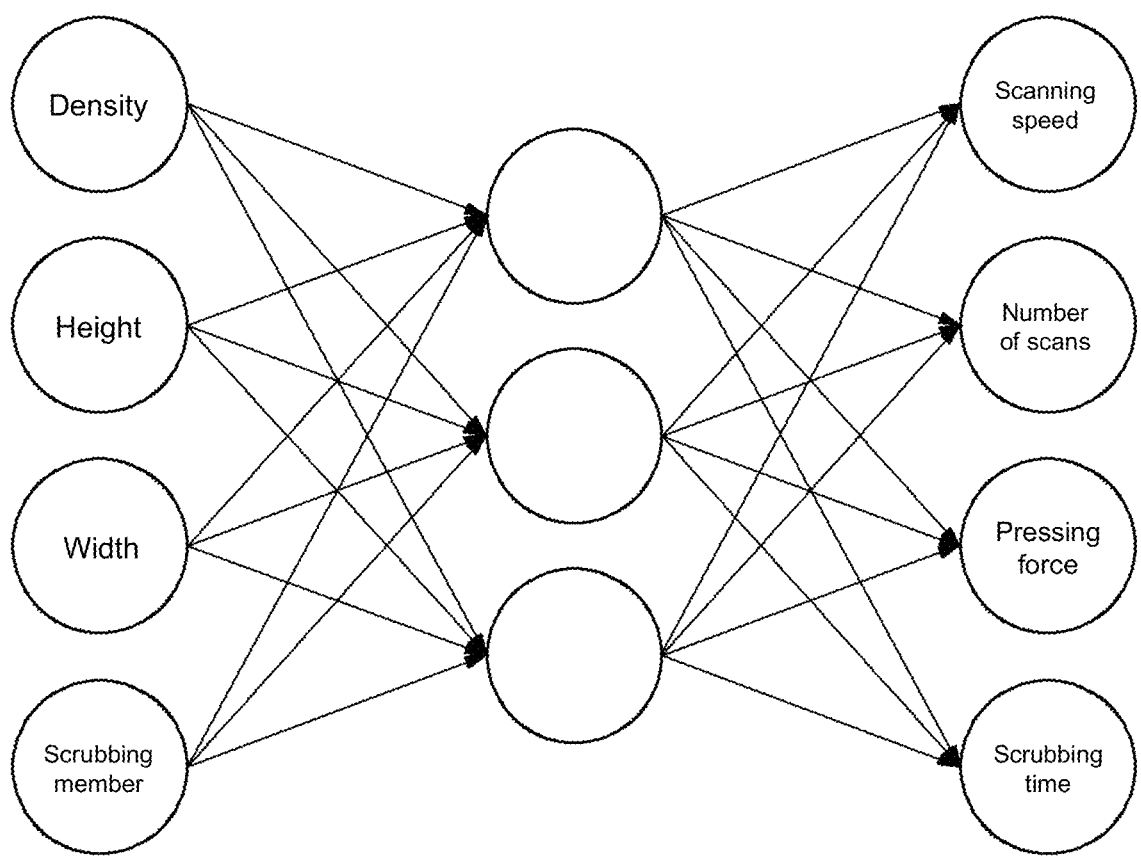
FIG. 18 shows an example of a recipe generating model stored in a model storage.

FIG. 18 shows an example of the recipe generating model stored in a model storage 40. The recipe generating model has an attribute of a scrubbing region and the like as input nodes, and conditions for performing scrubbing, i.e. a scrubbing recipe, as output nodes. The input nodes of the recipe generating model include the density of particles on a scrubbing region, the height and width of a scrubbing area, and a scrubbing member. The output nodes of the recipe generating model include the scanning speed and number of scans of a scrubbing member, the pressing force of a scrubbing member, and a scrubbing time.

The recipe generating model shown in FIG. 18 is just an example, and input and output nodes of the model for determining a scrubbing recipe are not limited to those illustrated in FIG. 18. Intermediate nodes between the input and output nodes may comprise not only one layer but also a plurality of layers.

The scrubbing recipe generator 33 puts attributes, namely the density of particles on a scrubbing region set by the scrubbing region setting unit 31 and the height and width of the scrubbing region, into input nodes as well as a scrubbing member selected by the scrubbing member selection unit 32 to determine the values of the output nodes. In this manner, the scrubbing recipe generator 33 can determine a scrubbing recipe, i.e. the conditions for performing scrubbing.

While in the embodiment a neural network model has been described as an example of a recipe generating model for determining a scrubbing recipe, not just a neural network model but also a decision tree model and a Bayesian network model can be used as a model for determining a scrubbing recipe.

The scrubbing control system 5 comprises a simulator 34 for checking a scrubbing recipe generated by the scrubbing recipe generator 33. The simulator 34 simulates a particle distribution to be obtained by performing scrubbing on a wafer in accordance with a scrubbing recipe.

The simulator 34 reads a simulation model stored in the model storage 40, puts the conditions of scrubbing into the simulation model, and thus calculates a particle distribution and throughput to be obtained after the scrubbing. If as a result the particle distribution and throughput of the wafer to be obtained after the scrubbing meet predetermined specifications, the simulator 34 determines that the generated scrubbing recipe is acceptable. If as a result of simulation the particle distribution or throughput does not meet a predetermined specification, the simulator 34 determines that the scrubbing recipe is unacceptable.

A scrubbing recipe transmitter 35 has a function to transmit data of a scrubbing recipe determined to be acceptable by the simulator 34's check to the scrubbing apparatus 900. Upon receiving the scrubbing recipe transmitted from the scrubbing control system 5 via a scrubbing recipe receiver 962, the scrubbing apparatus 900 operates various drives 961 to perform scrubbing in accordance with the received scrubbing recipe.

The various drives 961 are drives for driving the scrubbing apparatus 900 described with reference to FIG. 16 and include, for example, the substrate rotation mechanism 910, the scrubber elevating mechanism 926, the stage rotation mechanism 933, and the static pressure support mechanism 930.

After performing scrubbing on a wafer in accordance with a scrubbing recipe, the scrubbing apparatus 900 measures a particle distribution and transmits the measured particle distribution data from a scrubbing data transmitter 963 to the scrubbing control system 5. Upon receiving the particle distribution data transmitted from the scrubbing apparatus 900, the scrubbing control system 5 performs learning on the recipe generating model for generating a recipe using the received particle distribution data as a teaching signal. This allows for a continuous increase in the accuracy of the scrubbing recipe generating model on the basis of actual scrubbing data.

The scrubbing control system 5 also has an output unit 37. The output unit 37 comprises, for example, a display or other indicating means. The scrubbing control system 5 outputs, for example, a simulation result obtained by the simulator 34 from the output unit 37. This allows for a grasp of which part of a wafer is insufficiently scrubbed, how much scrubbing is further required to meet predetermined specifications, or the like when a simulation result is unacceptable. Consequently, a scrubbing recipe can be modified, or the recipe generating model for determining a scrubbing recipe can be adjusted.

Figure 19:
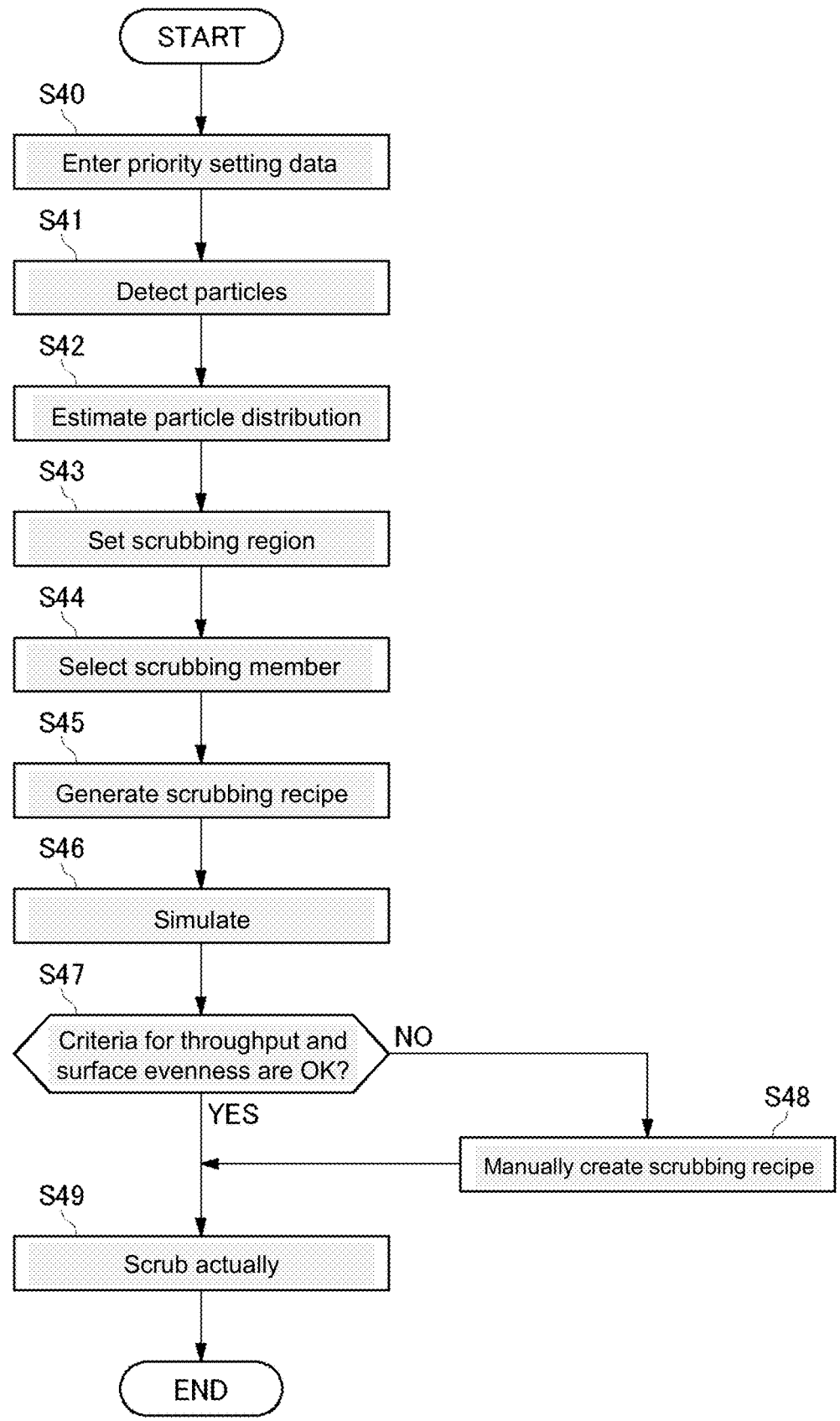
FIG. 19 shows an operation of the scrubbing control system controlling scrubbing.

FIG. 19 shows an operation of the scrubbing control system 5 controlling scrubbing. The scrubbing control system 5 accepts an entry for priority setting on whether priority is given to precision or throughput when scrubbing is performed (S40).

The scrubbing control system 5 detects particles on the wafer to be scrubbed (S41), and estimates the particle distribution based on the detection result (S42). The scrubbing control system 5 then sets scrubbing regions based on the estimated particle distribution (S43). The scrubbing region setting unit 31 sets the scrubbing regions based on whether the priority setting entered in advance is for precision or throughput.

The scrubbing control system 5 then, based on the sizes of the scrubbing regions, selects a scrubbing member for scrubbing each scrubbing region (S44). After that, the scrubbing control system 5 reads the recipe generating model for generating a recipe from the model storage 40, puts attributes of a scrubbing region and the type of a scrubbing member into the recipe generating model, and thus generates a scrubbing recipe for scrubbing the scrubbing region (S45).

The scrubbing control system 5 then simulates a particle distribution to be obtained by scrubbing the scrubbing region using the generated scrubbing recipe (S46). From the simulation result, the scrubbing control system 5 determines whether throughput satisfies a criterion and the particle distribution after scrubbing satisfies a criterion for the surface evenness or not (S47). If as a result the criteria are determined to be satisfied (YES at S47), the scrubbing control system 5 transmits the scrubbing recipe to the scrubbing apparatus 900, and the wafer is actually scrubbed (S49).

If as a result of the simulation the criteria for throughput and surface evenness are not satisfied (NO at S47), a scrubbing recipe is manually generated (S48) and actual scrubbing is performed with the generated scrubbing recipe (S49).

When the determination on whether the criteria for throughput and surface evenness are satisfied or not (S47) is made, whether throughput satisfies the criterion or not may be determined for each scrubbing region, or may be determined based on the total scrubbing time to be spent on scrubbing all the scrubbing regions.

There have been described a configuration and an operation of the scrubbing control system 5 of the fifth embodiment. The scrubbing control system 5 of the fifth embodiment generates a scrubbing recipe on the basis of a particle distribution estimated by the particle distribution estimation unit 30, and can therefore generate a scrubbing recipe without a precise one-by-one detection of particles on a wafer, so that a wafer can be scrubbed in a short time.

The scrubbing control system 5 of the fifth embodiment sets a scrubbing region on the basis of the priority setting, and can therefore perform scrubbing with precision or throughput being given priority.

The scrubbing control system 5 may store in the model storage 40 not only a neural network model but also models of a plurality of types such as a decision tree model and a Bayesian network model as the recipe generating model and may select one scrubbing recipe to be used for actual scrubbing from among a plurality of scrubbing recipes generated with a plurality of models. Specifically, the simulator simulates a scrubbing result to be obtained by performing scrubbing with the generated scrubbing recipes of a plurality of types, and the highest-performing scrubbing recipe is selected.

Like the local polishing control system described in the third embodiment, the scrubbing control system 5 may have an actual result data storage holding actual result data obtained from a previously used scrubbing recipe. The scrubbing control system 5 may select one scrubbing recipe to be used for actual scrubbing from among scrubbing recipes applied to wafers having particle distributions close to the particle distribution of a wafer to be processed. Specifically, clustering is performed on actual result data by means of attributes of a scrubbing region, and top five high-performing scrubbing recipes are selected from among actual result data included in a cluster approximate to attributes of a scrubbing region to be processed. The simulator then simulates a scrubbing result to be obtained by performing scrubbing with the selected scrubbing recipes of a plurality of types, and the highest-performing scrubbing recipe is selected.

Like the local polishing control system described in the fourth embodiment, the scrubbing control system may be connected via a network such as the Internet to multiple scrubbing apparatuses, so that it may have a so-called IoT configuration. The scrubbing control system comprises a receiver for receiving data on scrubbing transmitted from a plurality of scrubbing apparatuses, receives particle distribution data of a wafer to be processed or the like from a scrubbing apparatus connected via the network to the scrubbing control system, and generates and distributes a scrubbing recipe suited to the wafer. The scrubbing control system also performs learning on a recipe generating model for determining a scrubbing recipe, based on data of scrubbing results obtained by multiple scrubbing apparatuses.

While substrate processing control systems of the invention have been described in detail above with embodiments, the invention is not limited to the above-described embodiments. A neural network model has been mainly described as a model for generating a polishing recipe in embodiments described above, but the model is not limited to a neural network model, and models such as a decision tree model and a Bayesian network model can be used.

Sixth Embodiment

A local polisher and local polishing method of a sixth embodiment will be described next. The general configuration of the polisher is the same as that of above-described embodiments. Refer to FIGS. 1 and 2.

[Configuration of Controller]

Figure 20:
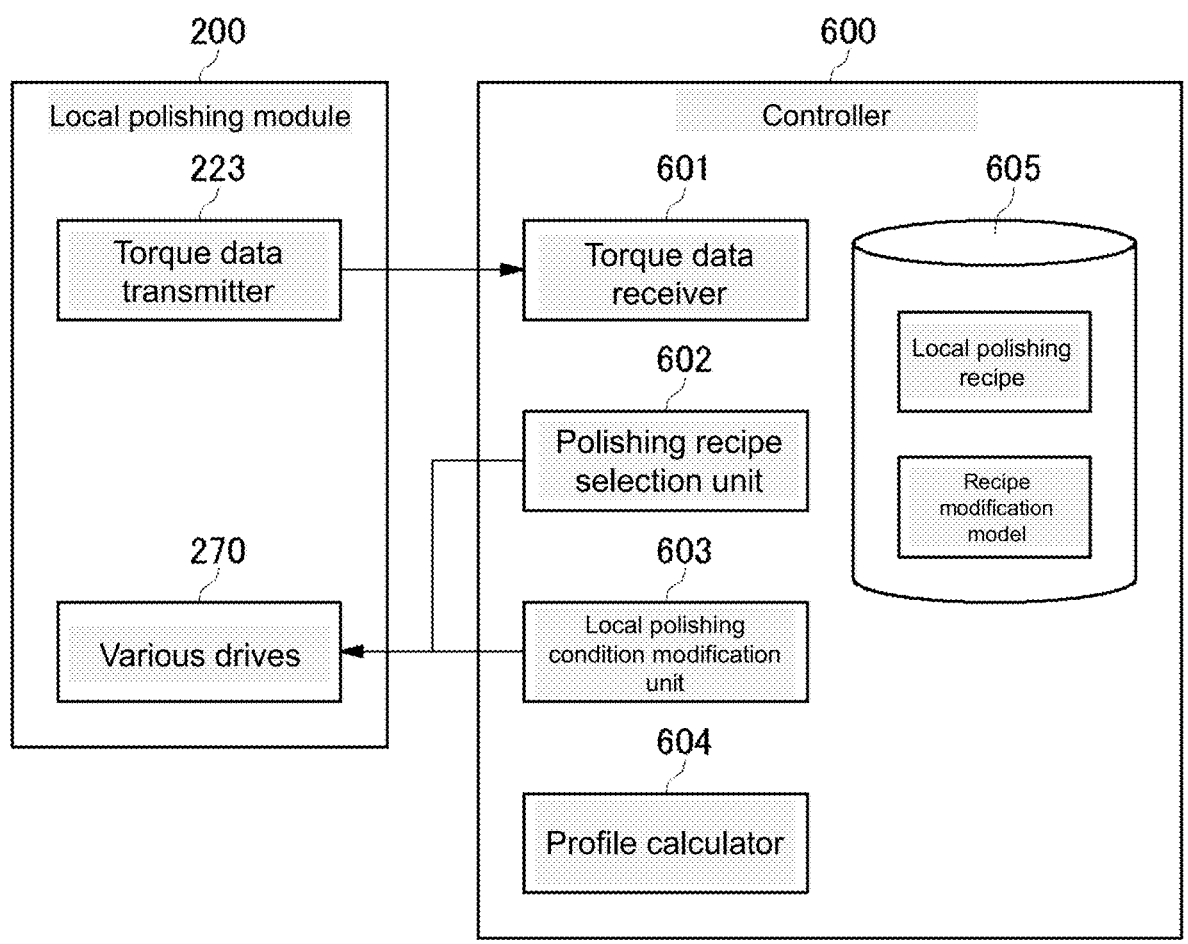
FIG. 20 shows a configuration of a controller of a sixth embodiment.

FIG. 20 shows a configuration of the controller 600. While a function block for controlling the local polishing module 200 is illustrated in FIG. 20, the controller 600 also has functions to control the entire polishing module 300, cleaning module 400, drying module 500, and transfer mechanism 700 described with FIG. 1. Functions other than that for controlling the local polishing module 200 are not described herein for simplicity. A local polisher of the invention comprises the local polishing module 200 and the controller 600.

The controller 600 has a torque data receiver 601 for receiving torque data from the local polishing module 200. The local polishing module 200 has a function to sense torque data required to rotate the head 221, and has a torque data transmitter 223 for transmitting sensed torque data to the controller 600. The torque data transmitter 223 transmits torque data throughout local polishing performed by the local polishing module 200, and the torque data receiver 601 receives the data.

The controller 600 has a polishing recipe selection unit 602. A plurality of local polishing recipes that vary from condition to condition are stored in a storage 605. The various conditions are, for example, the height and extent of projections obtained from a result of measuring the film thickness of a wafer to be polished, an etching pattern of a wafer, and conditions of entire polishing performed on a wafer. The polishing recipe selection unit 602 has a function to select a polishing recipe to be used for local polishing suited to conditions of a wafer from among a plurality of local polishing recipes stored in the storage 605. The polishing recipe selected here is used at the start of local polishing.

The polishing recipe selection unit 602 transmits data of the selected polishing recipe to the local polishing module 200. Upon receiving the data of the polishing recipe, the local polishing module 200 operates the various drives 270 to perform local polishing on the wafer in accordance with the received polishing recipe. Note here that the various drives 270 are drives for driving the local polishing module 200 described with reference to FIG. 2 and include, for example, the drive mechanism 211 for the table 210, a drive mechanism for the arm 222, a rotary drive mechanism for rotating the polishing pad 220, an actuator for pressing the polishing pad 220 against a wafer, and the on/off valves 244, 248, and 251 to 253 of the processing liquid supply system 240.

The controller 600 has a local polishing condition modification unit 603. The local polishing condition modification unit 603 has a function to modify a polishing condition that can be changed during polishing, of a plurality of polishing conditions specified by a polishing recipe. A polishing recipe specifies various polishing conditions, such as the size of a head to be used for polishing, the material of a polishing pad, the type of slurry, the speed of rotation of a polishing head, the scanning speed of a polishing head, the pressing force of a polishing head, and the supply of slurry. Of these conditions, conditions of the size of a head to be used for polishing, the material of a polishing pad, and the type of slurry are determined at the start of local polishing, and the same conditions are used until the end of the polishing. On the other hand, conditions of the speed of rotation of a polishing head, the scanning speed of a polishing head, the pressing force of a polishing head, and the supply rate of slurry can be changed during polishing.

The local polishing condition modification unit 603 has a recipe modification model for appropriately modifying a polishing recipe based on torque data during local polishing. A neural network model is used as the recipe modification model in the embodiment, but the recipe modification model is not limited to a neural network model, and models such as a decision tree model and a Bayesian network model can be used.

Figure 21:
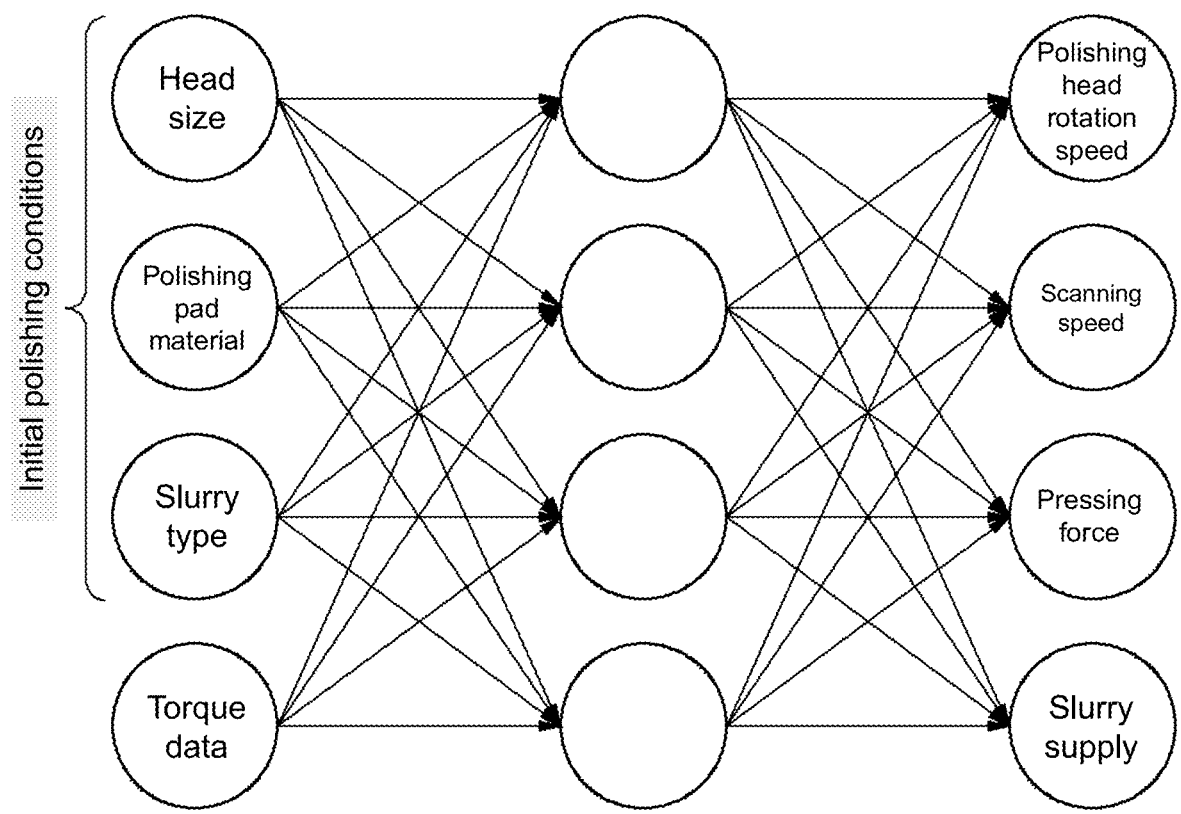
FIG. 21 shows an example of a recipe modification model stored in a storage.

FIG. 21 shows an example of the recipe modification model stored in the storage 605. The recipe modification model has nodes of initial polishing conditions and torque data as input nodes. Nodes of the initial conditions include nodes of a polishing head size, a polishing pad material, and a slurry type. These conditions are specified by a polishing recipe selected by the polishing recipe selection unit 602, and the contents of their nodes do not change during local polishing. Values of a polishing recipe first selected by the polishing recipe selection unit 602 are put into these nodes. The recipe modification model has nodes of a polishing head rotation speed, a scanning speed, a polishing head pressing force, and slurry supply, as output nodes.

The recipe modification model shown in FIG. 21 is just an example, and input and output nodes of the model for determining a polishing recipe are not limited to those illustrated in FIG. 21. For example, the recipe modification model may have nodes of the number of scans, polishing time, and the like as output nodes. Intermediate nodes between the input and output nodes may comprise not only one layer but also a plurality of layers.

The local polishing condition modification unit 603 has a function to read the recipe modification model from the storage 605, and puts torque data received by the torque data receiver 601 into an input node of the recipe modification model to determine a local polishing condition for modifying a polishing recipe. Based on the torque data received by the torque data receiver 601, the local polishing condition modification unit 603 modifies a local polishing condition when a change in the torque crosses a predetermined threshold. For example, the torque data receiver 601 receives torque data at intervals of 0.5 seconds and when a difference in received torque data between the previous time and the current time, $\Delta T$, crosses a predetermined threshold, the torque data received the current time is put into the recipe modification model to determine a new polishing condition.

The local polishing condition modification unit 603 transmits data of the determined polishing condition to the various drives 270 of the local polishing module 200. The local polishing module 200 uses the received polishing condition data to modify the first-received polishing recipe, and operates the various drives 270 to perform local polishing in accordance with the new polishing recipe.

The controller 600 has a profile calculator 604 for calculating the surface unevenness of a locally-polished wafer based on a polishing condition used for performing local polishing and the torque during polishing. A polishing condition and the torque vary during local polishing, but the amount of polishing can be calculated from a polishing condition and the torque for a time while the identical polishing condition is used. The profile calculator 604 determines and adds up the amount of polishing for every polishing condition to calculate the amount of polishing caused by local polishing.

Figure 22:
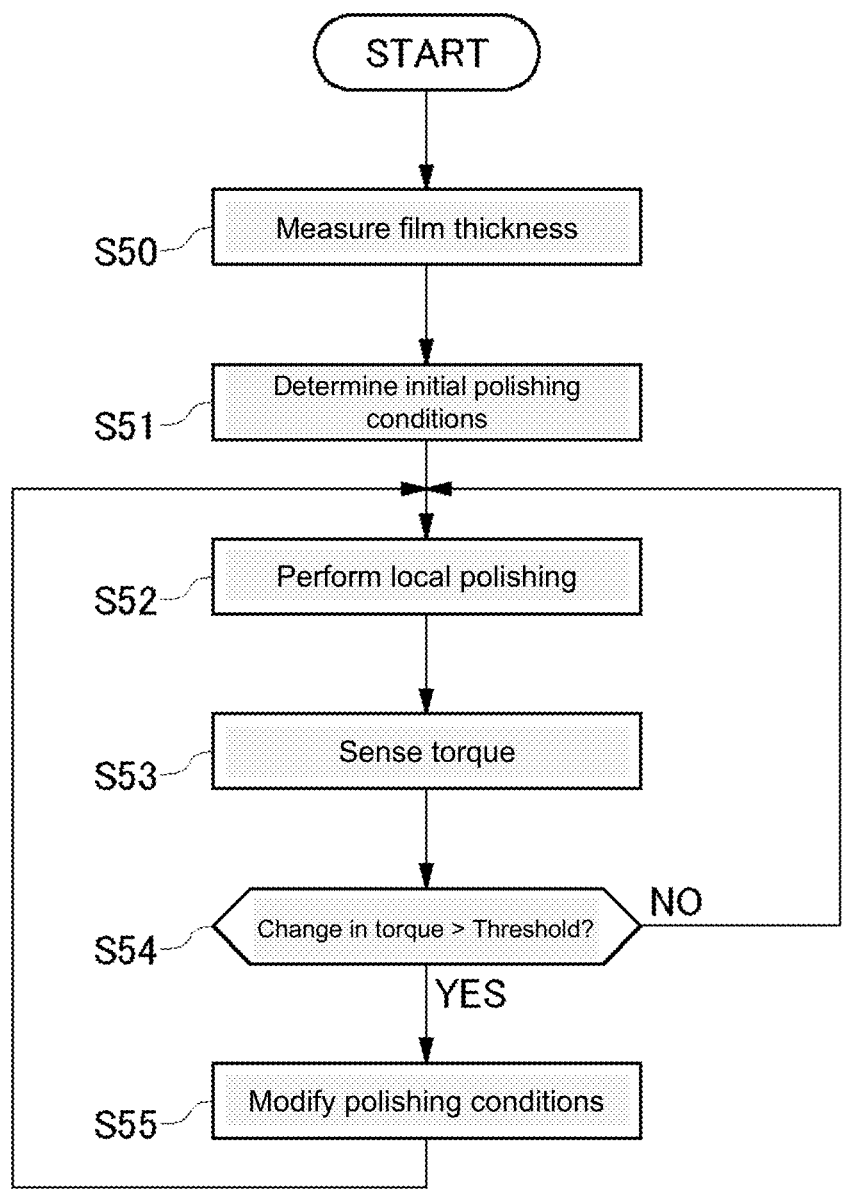
FIG. 22 is a flowchart showing an operation of a local polisher of the sixth embodiment.

FIG. 22 is a flowchart showing an operation of the local polisher of the embodiment. The local polisher first measures the film thickness of a wafer to be polished (S50), and selects from among local polishing recipes stored in the storage 605 a polishing recipe suited to the film thickness measurement data, an etching pattern of the wafer, conditions of entire polishing performed on the wafer, and the like to determine initial polishing conditions (S51).

The local polishing module 200 receives data of the determined polishing recipe from the controller 600, and performs local polishing on the wafer according to the received polishing recipe (S52). The local polishing module 200 senses data on torque required to rotate the head 221 during local polishing (S53), and transmits the torque data to the controller 600.

The controller 600 determines whether a change in the torque crosses a predetermined threshold or not based on the received torque data (S54) and, if the change in the torque is determined not to cross the predetermined threshold (NO at S54), continues the local polishing with the polishing conditions unchanged (S52). If the change in the torque is determined to cross the predetermined threshold (YES at S54), the local polishing condition modification unit 603 uses the sensed torque data to modify the polishing conditions (S55) and performs local polishing with the modified polishing conditions (S52). Specifically, the controller 600 transmits the modified polishing conditions to the local polishing module 200, which uses the received polishing conditions to modify the polishing recipe and performs polishing on the wafer in accordance with the modified polishing recipe.

The local polisher of the embodiment can prevent inconvenience caused by too much or too little polishing even if the surface condition of a wafer is different from that predicted at the beginning, since, when the torque during local polishing varies more than a predetermined threshold, the local polisher modifies part of polishing conditions of the polishing recipe based on the torque and performs local polishing with the new polishing recipe.

The local polisher of the embodiment can determine whether a wafer satisfies predetermined specifications or not even if the film thickness of the wafer is not actually measured after polishing, since the profile calculator 604 calculates the surface unevenness of a locally-polished wafer based on torque data sensed during the local polishing and the polishing conditions.

While a local polisher and local polishing method of the invention have been described in detail above with an embodiment, the invention is not limited to the above-described embodiment. The local polishing condition modification unit 603 modifies polishing conditions based on torque data (S55 in FIG. 22) when a change in torque crosses a predetermined threshold (YES at S54 in FIG. 22) in the embodiment described above, but whether polishing conditions are to be modified or not may be determined depending on whether torque data instead of a change in torque crosses a predetermined threshold or not.

Figure 23:
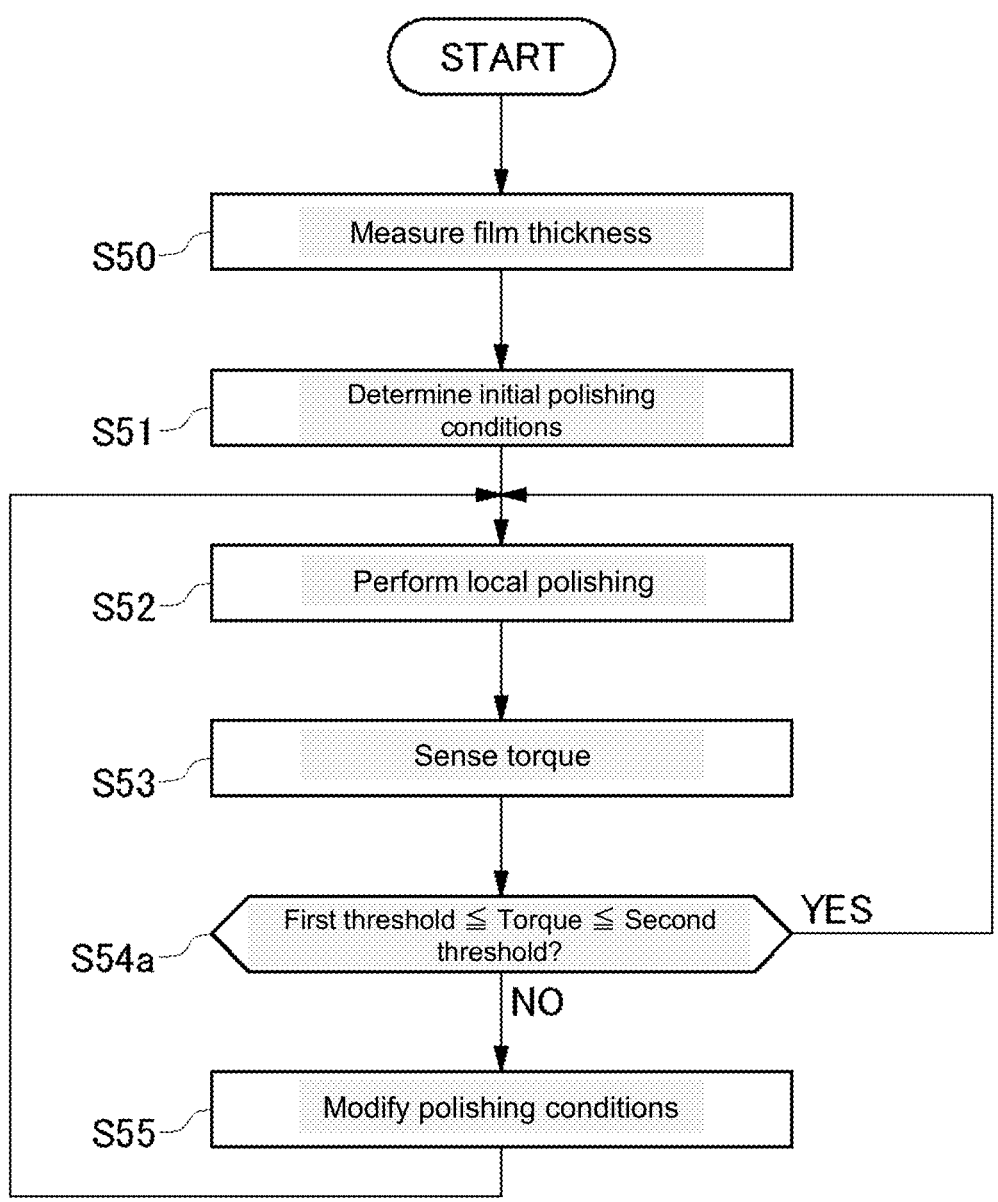
FIG. 23 is a flowchart showing an operation of a local polisher according to a variation of the sixth embodiment.

FIG. 23 is a flowchart showing an operation for modifying polishing conditions depending on the absolute value of torque data. While the operation is basically the same as that of the example shown in FIG. 22, a determination is made on whether the torque during local polishing is between first and second thresholds or not (the step S54a). If the torque during local polishing is between the first and second thresholds (YES at S54a), the polishing is continued with the polishing conditions unchanged (S52). If the torque goes out of the range defined by the first and second thresholds, that is, if the torque goes below the first threshold or above the second threshold (NO at S54a), the local polishing condition modification unit 603 uses the sensed torque data to modify the polishing conditions (S55) and performs local polishing with the modified polishing conditions (S52).

With this configuration in which whether the absolute value of the torque is between predetermined thresholds or not is determined and polishing conditions are changed when the value crosses either of the predetermined thresholds, the local polisher can control whether local polishing is being performed within a predetermined torque range or not. If the torque data indicates an unexpected value, the local polisher determines that the polishing is not being performed under expected conditions and changes polishing conditions, thus being able to prevent inconvenience caused by too much or too little polishing. While this variation has been described with the example in which the determination is made according to the absolute value of the torque, the determination on whether polishing conditions are to be changed or not may be made by taking into consideration both a change in torque and the absolute value of the torque.

Figure 24:
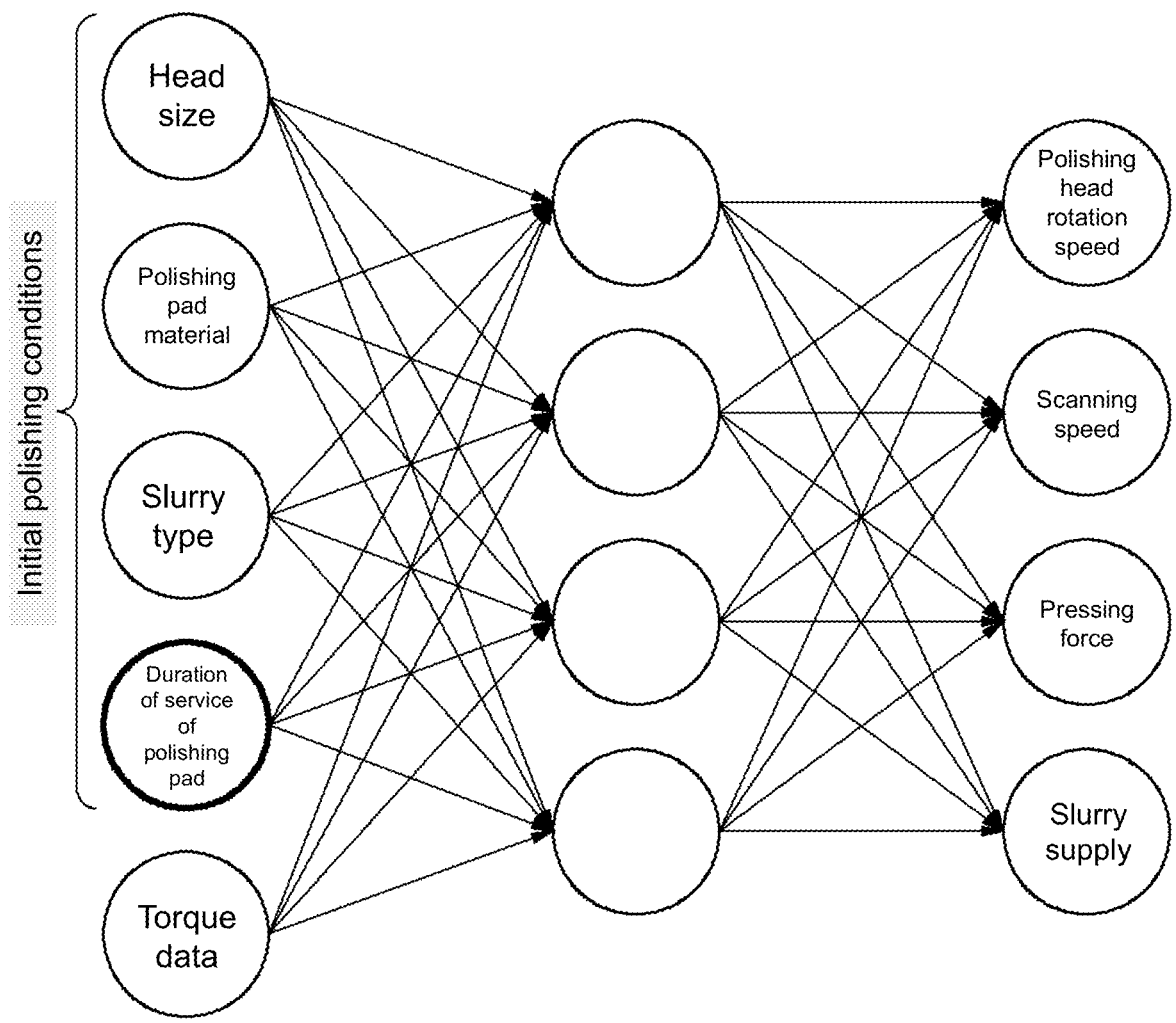
FIG. 24 shows an example of a recipe modification model according to a variation.

The recipe modification model described in the above embodiment may have a node of the duration of service of a polishing pad as an input node. FIG. 24 shows an example of a recipe modification model according to a variation. The duration of service of a polishing pad is not a value that changes during local polishing, and is therefore included in initial polishing conditions. A difference in the duration of service of a polishing pad could cause a difference in the amount of polishing even if the other conditions are the same. Since the duration of service of a polishing pad reflects the degree of wear and deterioration of the polishing pad, accurate polishing conditions can be determined with the duration of service of a polishing pad being an input node.

While the above embodiment has been described with the example in which a local polishing recipe for the start of local polishing is determined by selecting a local polishing recipe suited to the conditions from a plurality of local polishing recipes, the initial local polishing recipe may be determined by another method. For example, the local polishing recipe may be generated in accordance with the surface condition of a wafer to be processed predicted on the basis of a result of measuring the film thickness of the wafer to be processed, a condition of an upstream manufacturing process of the wafer to be processed, and the like. Even if the polishing recipe is predictively generated in this manner, the local polisher of the invention can perform polishing appropriately since it senses the torque and dynamically changes polishing conditions during the local polishing.

Seventh Embodiment

A polisher and polishing method of a seventh embodiment will be described next. The general configuration of the polisher is the same as that of above-described embodiments. Refer to FIGS. 1 and 2.

[Controller]

Figure 25:
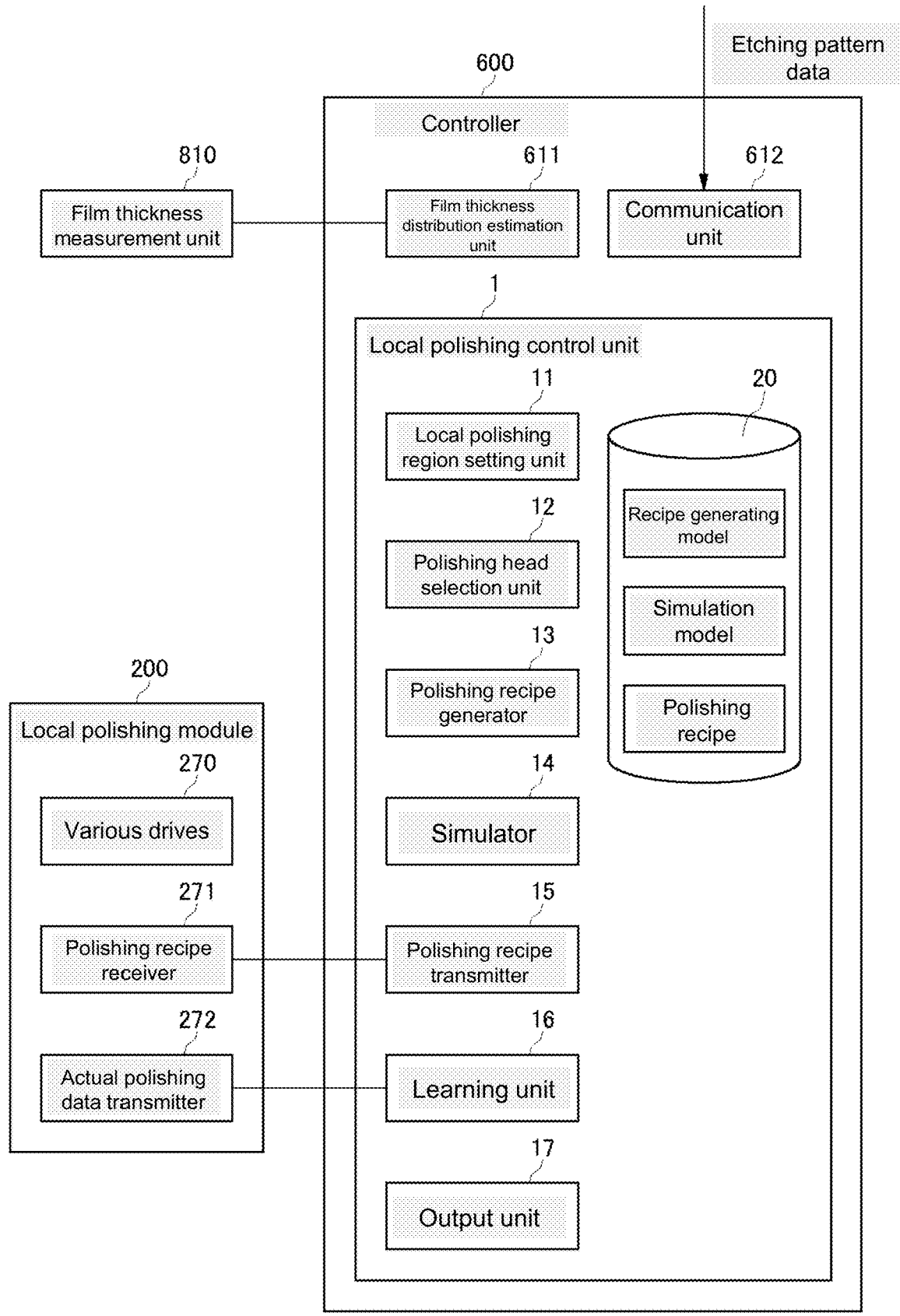
FIG. 25 is a function block diagram showing functions of a controller of a seventh embodiment.

FIG. 25 is a function block diagram showing functions of the controller 600. Functions of the controller 600 other than that for controlling the local polishing module 200 are not described herein for simplicity. The controller 600 has a film thickness distribution estimation unit 611, a communication unit 612, and a local polishing control unit 1 for controlling the local polishing module 200. The communication unit 612 has a function to communicate with an upstream apparatus that performs an etching process or the like, and receives data on an etching pattern given upstream or the like.

A film thickness distribution estimation unit 611 is connected to a film thickness measurement unit 810 that measures the film thickness of a wafer to be processed. The local polishing module 200, the entire polishing module 300, or other modules may comprise the film thickness measurement unit 810. Specific examples of the film thickness measurement unit 810 are the detecting head 230 and sensor 232 described above.

The film thickness distribution estimation unit 611 has a function to estimate the film thickness distribution of a wafer to be polished. The film thickness distribution estimation unit 611 estimates the film thickness distribution of a wafer based on data of a result of measuring the film thickness of the wafer received from the film thickness measurement unit 810 and data on an etching pattern received via the communication unit 612. Since projections and depressions on the surface of a wafer are affected by an underlying wiring pattern, the film thickness of a region not measured by the film thickness measurement unit 810 can be precisely complemented by using data on an etching pattern. The film thickness distribution estimation unit 611 estimates the film thickness distribution of a wafer in this manner, and therefore the film thickness measurement unit 810 is not required to perform a precision measurement, so that the time required for the film thickness measurement can be reduced. While the embodiment gives a description of the example where the film thickness distribution is estimated by also using data on an etching pattern used in an upstream etching process, the use of data on an etching pattern is not essential, and the film thickness distribution estimation unit 611 may be configured to estimate the film thickness distribution only from data of a result of measuring the film thickness of a wafer.

The local polishing control unit 1 has the local polishing region setting unit 11, the polishing head selection unit 12, the polishing recipe generator 13, and a recipe generating model stored in the storage 20, as a configuration for generating a polishing recipe for local polishing.

Figure 26A:
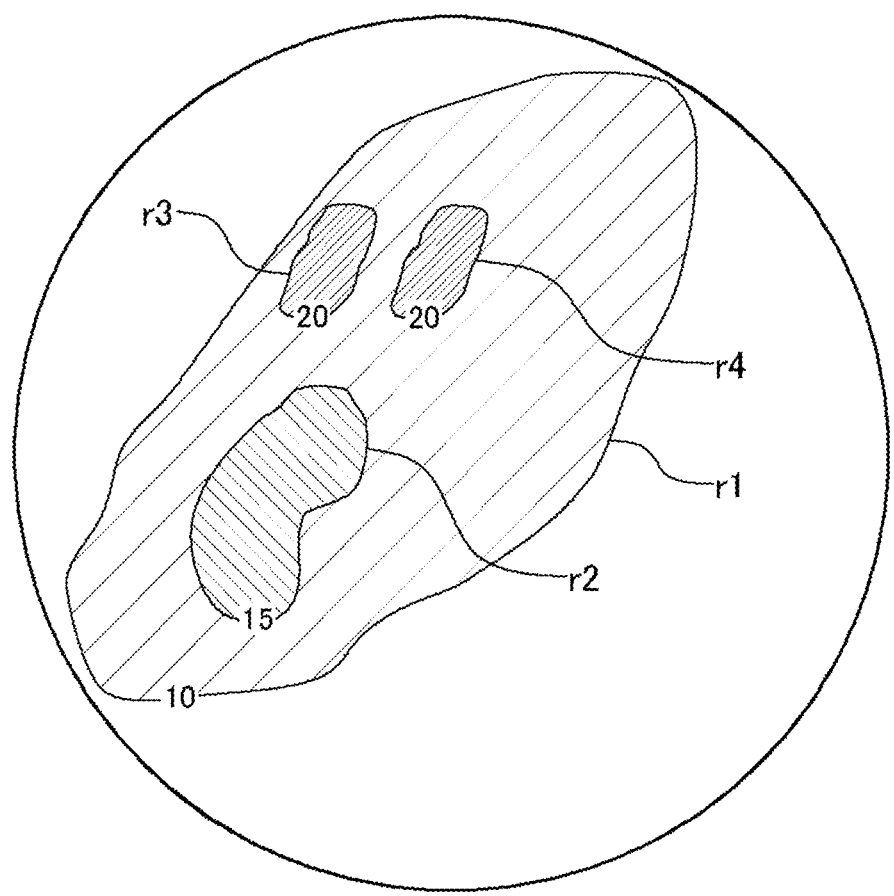
FIG. 26A is a contour plot showing the film thickness distribution of a yet-to-be-polished wafer estimated by a film thickness distribution estimation unit.

FIG. 26A is a contour plot showing the film thickness distribution of a wafer to be polished estimated by the film thickness distribution estimation unit 611. In FIG. 26A, the film thickness distribution is expressed by contour lines representing heights of 10, 15, and 20. The example shown in FIG. 26A has a region r1 enclosed by a contour line representing a height of 10, a region r2 enclosed by a contour line representing a height of 15, and two regions r3 and r4 enclosed by contour lines representing a height of 20.

While in the FIG. 26A the contour plot is expressed in three different types of contour lines, how many levels the height is divided into can be set as appropriate. With the number of divisions determined, the film thickness distribution estimation unit 611 can calculate {(maximum height)−(minimum height)}/(number of divisions) to determine heights to be represented by contour lines.

Figure 26B:
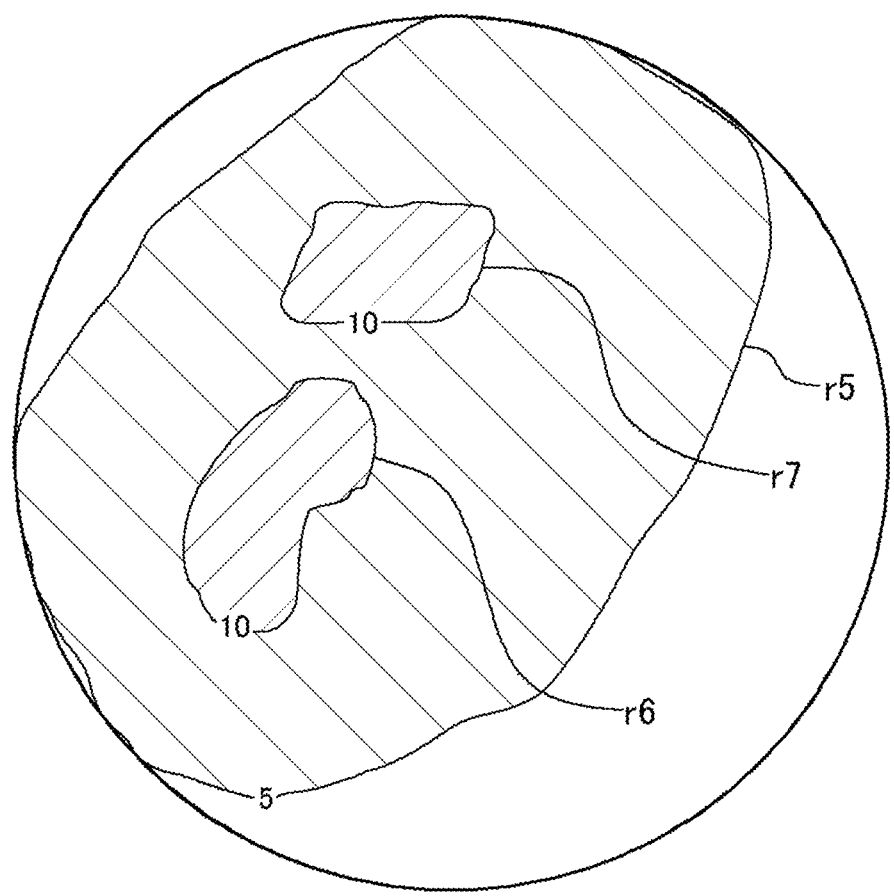
FIG. 26B shows a film thickness distribution estimated on the assumption that a wafer has been entirely polished.

The local polishing region setting unit 11 has a function to set a local polishing region based on a film thickness distribution estimated by the film thickness distribution estimation unit 611 and the planarization capability of entire polishing. FIG. 26B illustrates the planarization capability of entire polishing, and shows a film thickness distribution estimated on the assumption that the wafer having the film thickness distribution shown in FIG. 26A has been entirely polished. The estimated film thickness distribution can be obtained by simulating the amount of polishing based on polishing conditions of the entire polishing.

In the example shown in FIG. 26B, the film thickness distribution estimated with the planarization capability considered has a region r5 enclosed by a contour line representing a height of 5, and regions r6 and r7 enclosed by contour lines representing a height of 10. This example illustrates that the regions r3 and r4 shown in FIG. 26A are polished by the entire polishing to the same height as the contour line representing a height of 10 and unite into one region represented by a contour line 10 (representing heights from 10 to 14).

The local polishing region setting unit 11 sets local polishing regions based on the film thickness distribution shown in FIG. 26B estimated on the assumption that the entire polishing has been performed. Each of the regions r5 to r7 is set as a local polishing region in this example.

Figure 27:
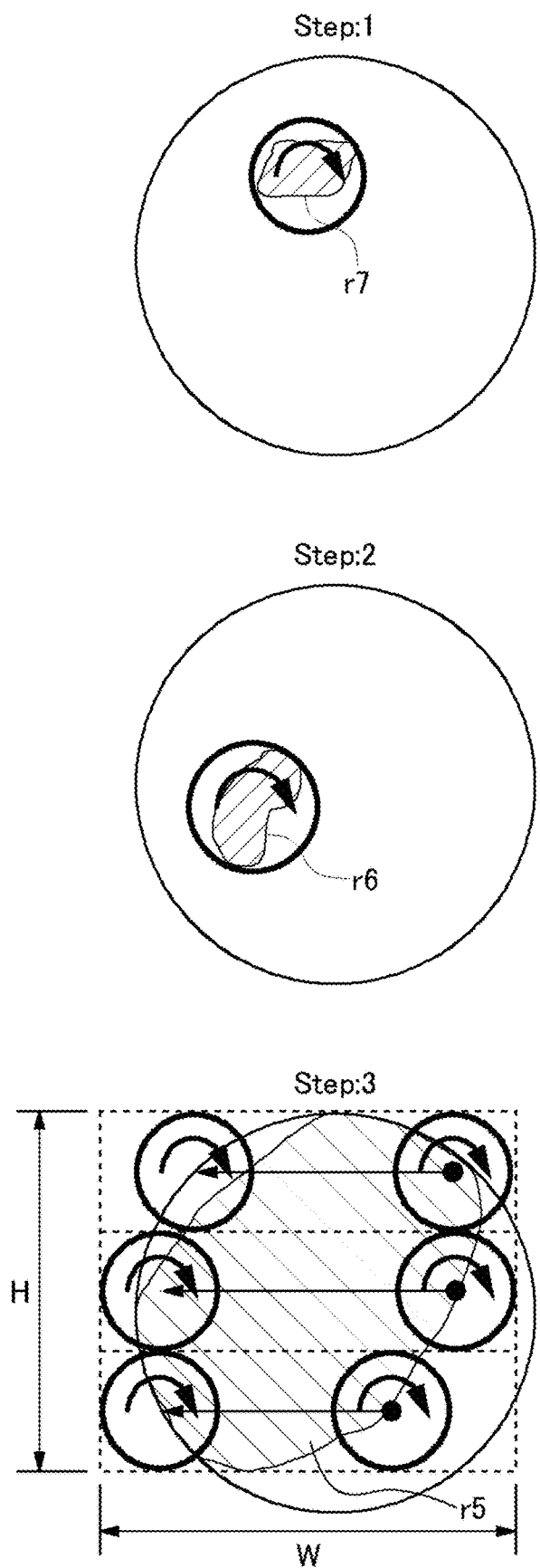
FIG. 27 shows polishing heads to be used in the steps and their movements when local polishing regions are set.

FIG. 27 shows polishing heads to be used in the steps and their movements when local polishing regions are set for the regions r5 to r7. Three steps are required to locally polish the local polishing regions for the regions r5 to r7 in this example.

The polishing head selection unit 12 selects a polishing head based on the size of a local polishing region. A polishing head of a correct size to cover each of the local polishing regions r7 and r6 is selected for each of the steps 1 and 2. For the step 3, a polishing head of a size to efficiently perform local polishing is selected since no polishing head covers the local polishing region r5. Specifically, local polishing is performed on the region r5 by setting a rectangle scanning area (height H by width W) covering the local polishing region r5 to scan this scanning area with the polishing head.

The polishing recipe generator 13 has a function to determine a polishing recipe for polishing a local polishing region. The polishing recipe generator 13 first determines an area covering a local polishing region with a polishing head. Describing with reference to FIG. 27, polishing heads completely cover each local polishing region in the steps 1 and 2, and it is then only required to determine the positions of the polishing heads for polishing. The local polishing region in the step 3 is larger than its polishing head, and then the height H and width W of the rectangle scanning area covering the local polishing region are determined. A track of the polishing head for scanning the scanning area completely in a short time is then determined.

The polishing recipe generator 13 then determines other conditions for performing local polishing. Specifically, the polishing recipe generator 13 uses the recipe generating model read from the storage 20 to determine a polishing recipe according to an attribute of a local polishing region. A neural network model is used as the recipe generating model in the embodiment.

Figure 28:
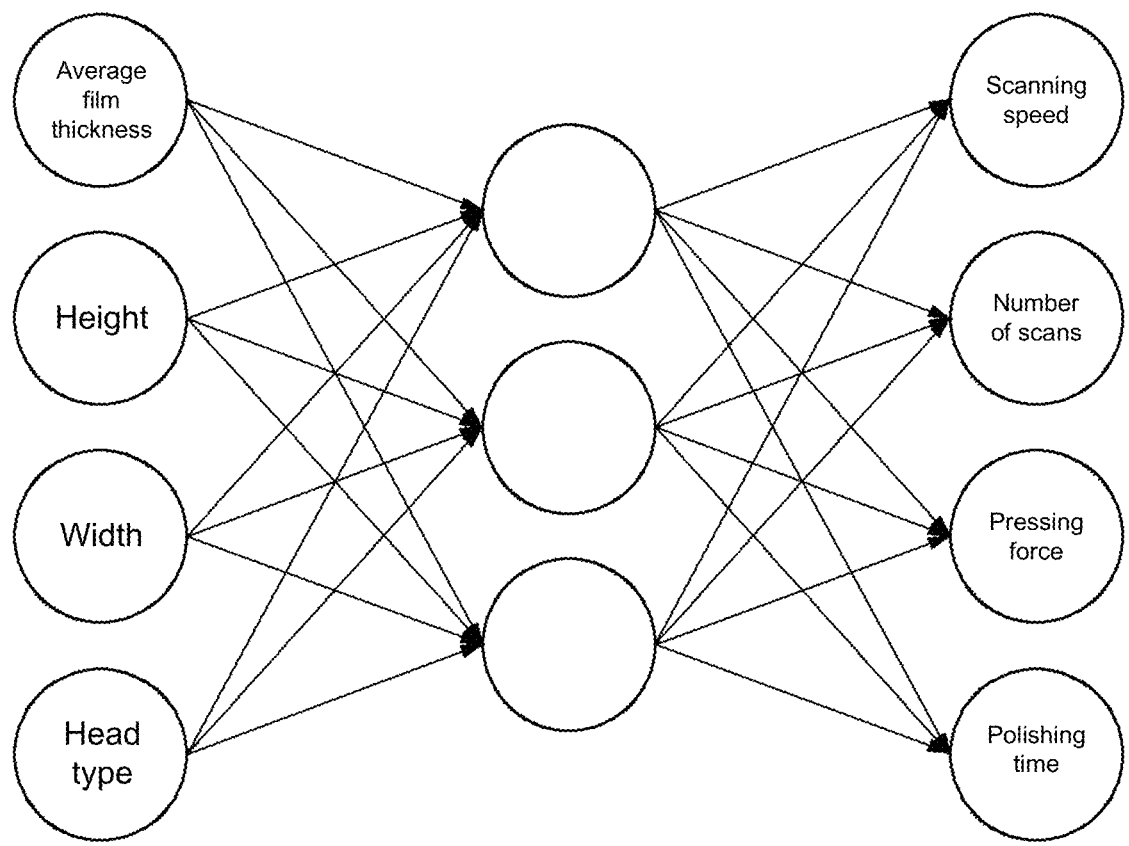
FIG. 28 shows an example of a recipe generating model stored in a model storage.

FIG. 28 shows an example of the recipe generating model stored in the model storage 20. The recipe generating model has an attribute of a local polishing region and the like as input nodes, and conditions for performing polishing, i.e. a polishing recipe, as output nodes. The recipe generating model has nodes of the average film thickness of a local polishing region, the height and width of a scanning area, and a head type, as input nodes. The recipe generating model has nodes of a scanning speed, the number of scans, the pressing force of a polishing pad, and a polishing time, as output nodes. When it is not required to scan with a polishing head as in the steps 1 and 2 in FIG. 27, input nodes of attributes, namely the height and width of a scanning area, and output nodes including a scanning speed and the number of scans are treated as nonexistent.

The recipe generating model shown in FIG. 28 is just an example, and input and output nodes of the model for determining a polishing recipe are not limited to those illustrated in FIG. 28. For example, the recipe generating model may have nodes of the speed of rotation of a polishing head, the supply rate of slurry, and the like as output nodes. Intermediate nodes between the input and output nodes may comprise not only one layer but also a plurality of layers.

The polishing recipe generator 13 puts attributes, namely the average film thickness of a local polishing region set by the local polishing region setting unit 11 and the height and width of a scanning area, into input nodes as well as a polishing head selected by the polishing head selection unit 12 to determine the values of the output nodes. In this manner, the polishing recipe generator 13 can determine a polishing recipe, i.e. the conditions for performing local polishing.

While in the embodiment a neural network model has been described as an example of the recipe generating model for determining a polishing recipe, not just a neural network model but also a decision tree model and a Bayesian network model can be used as a model for determining a polishing recipe.

Returning to FIG. 25, the description will be continued. The local polishing control unit 1 comprises the simulator 14 for checking a polishing recipe generated by the polishing recipe generator 13. The simulator 14 simulates a film thickness distribution to be obtained by performing local polishing on a wafer in accordance with a polishing recipe.

The simulator 14 reads a simulation model stored in the storage 20, puts the conditions of local polishing into the simulation model, and thus calculates a film thickness distribution to be obtained after the local polishing, and throughput. If as a result the film thickness distribution of the wafer to be obtained after the local polishing and the throughput meet predetermined specifications, the simulator 14 determines that the generated polishing recipe is acceptable. If as a result of simulation the film thickness distribution or the throughput does not meet a predetermined specification, the simulator 14 determines that the polishing recipe is unacceptable.

The polishing recipe transmitter 15 has a function to transmit data of a polishing recipe determined to be acceptable by the simulator 14's check to the local polishing module 200. Upon receiving the polishing recipe transmitted from the local polishing control unit 1 via the polishing recipe receiver 271, the local polishing module 200 operates the various drives 270 to perform local polishing in accordance with the received polishing recipe.

The various drives 270 are drives for driving the polisher 100 described with reference to FIG. 2 and include, for example, the drive mechanism 211 for the table 210, the drive mechanism for the arm 222, the rotary drive mechanism for rotating the polishing pad 220, the actuator for pressing the polishing pad 220 against a wafer, and the on/off valves 244, 248, and 251 to 253 of the processing liquid supply system 240.

After performing local polishing on a wafer in accordance with a polishing recipe, the local polishing module 200 measures a film thickness and transmits the measured film thickness data from the actual polishing data transmitter 272 to the local polishing control unit 1. Upon receiving the film thickness data transmitted from the local polishing module 200, the local polishing control unit 1 causes a learning unit 16 to perform learning on the recipe generating model using the received film thickness data as a teaching signal. This allows for a continuous increase in the accuracy of the recipe generating model based on actual polishing data.

The local polishing control unit 1 also has the output unit 17. The output unit 17 comprises, for example, a display or other indicating means. The local polishing control unit 1 outputs, for example, a simulation result obtained by the simulator 14 from the output unit 17. This allows for a grasp of which part of a wafer is insufficiently polished, how much polishing is further required to meet predetermined specifications, or the like when a simulation result is unacceptable. Consequently, a polishing recipe can be modified, or the neural network model for determining a polishing recipe can be adjusted.

Figure 29:
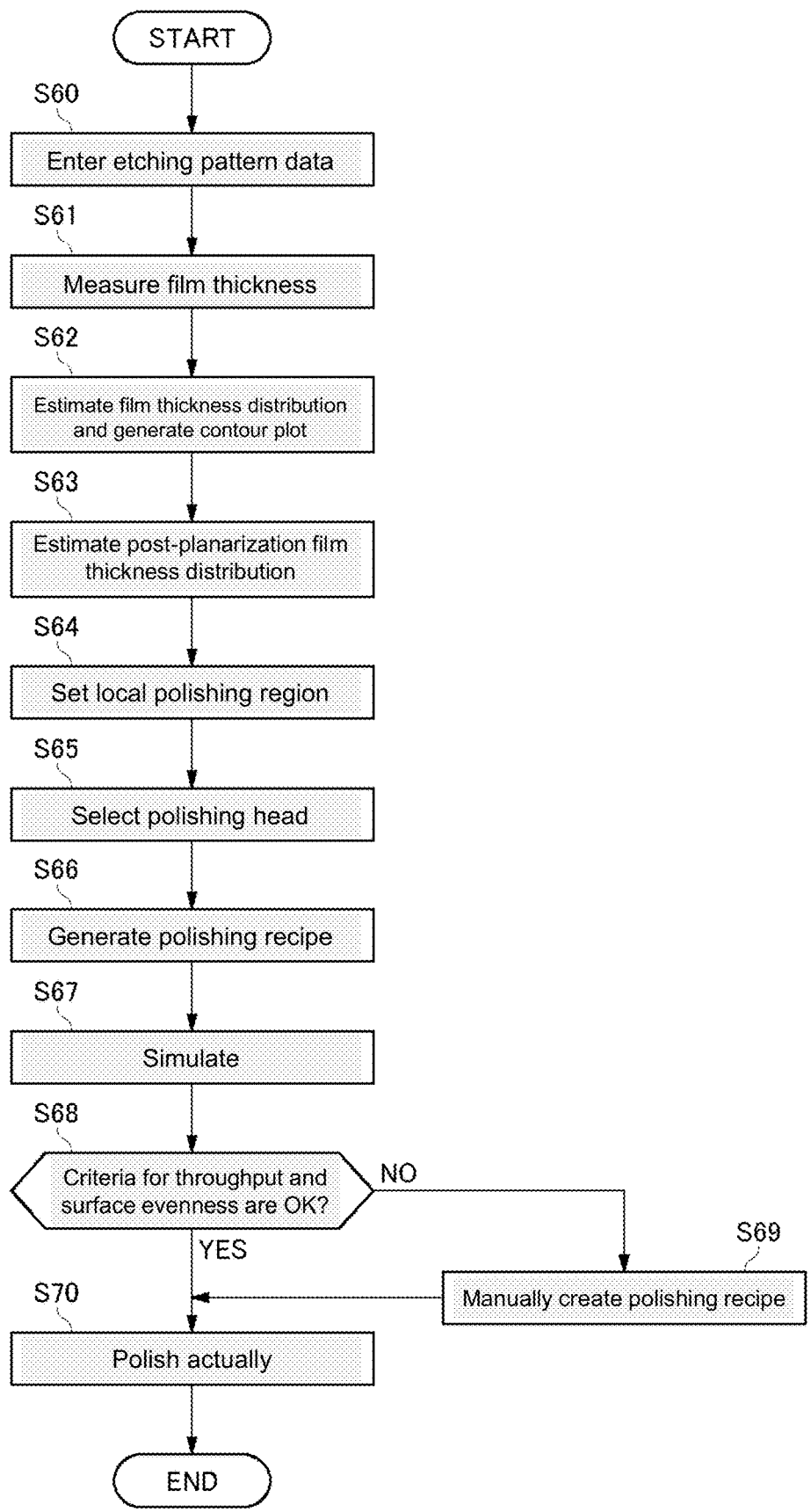
FIG. 29 shows an operation of a polisher controlling local polishing.

FIG. 29 shows an operation of the polisher 100 (see FIG. 1) controlling local polishing. The controller 600 receives data on an etching pattern of a wafer to be locally polished via the communication unit 612 (S60). The film thickness measurement unit 810 measures the film thickness of the wafer to be polished (S61), and the film thickness distribution estimation unit 611 estimates the film thickness distribution based on the film thickness measurement result and the etching pattern, and generates a contour plot (S62). The film thickness distribution estimation unit 611 then estimates a post-planarization film thickness distribution to be obtained by performing entire polishing, based on the film thickness distribution of the yet-to-be-processed wafer (S63). The local polishing region setting unit 11 sets local polishing regions based on the estimated film thickness distribution (S64).

The local polishing control unit 1 then, based on the sizes of the local polishing regions, selects a polishing head for polishing each local polishing region (S65). After that, the local polishing control unit 1 reads the recipe generating model for generating a recipe from the model storage 20, puts attributes of a local polishing region and the type of a polishing head into the recipe generating model, and thus generates a polishing recipe for polishing the local polishing region (S66).

The local polishing control unit 1 then simulates a film thickness distribution to be obtained by polishing the local polishing region using the generated polishing recipe and further performing entire polishing (S67). From the simulation result, the local polishing control unit 1 determines whether throughput satisfies a criterion and the film thickness to be obtained by polishing satisfies a criterion for the surface evenness or not (S68). If as a result the criteria are determined to be satisfied (YES at S68), the local polishing control unit 1 stores the polishing recipe in the storage 20 as well as transmits the polishing recipe to the local polishing module 200, and the wafer is actually polished (S70).

If as a result of the simulation the criteria for throughput and surface evenness are not satisfied (NO at S68), a polishing recipe is manually generated (S69) and actual polishing is performed with the generated polishing recipe (S70). When wafers of the same type are processed, it is not required to generate a polishing recipe each time, and local polishing is performed by using a previously generated polishing recipe. This allows time for generating a polishing recipe to be omitted, and thus can increase throughput.

In the polisher of the embodiment, the local polishing region setting unit 11 sets a local polishing region with consideration for the planarization capability of entire polishing, and therefore throughput can be improved with entire and local polishing coupled with each other.

While a polisher and polishing method of the invention have been described in detail above with an embodiment, the invention is not limited to the above-described embodiment. The above embodiment has been described with the example in which the film thickness distribution estimation unit 611 estimates a film thickness distribution based on a measurement result obtained by the film thickness measurement unit 810, but the film thickness distribution estimation unit 611 may estimate a film thickness distribution based on information on a preceding process performed on a wafer to be processed, instead of using a film thickness measurement result. Information on a preceding process includes, for example, characteristics of a film coating machine, a wiring pattern layout, conditions for CVD (the gas flow rate and temperature), and operating conditions for a plating machine, as well as an etching pattern also cited in the above embodiment.

The invention claimed is:

1. A system for controlling a polisher that locally polishes a substrate, the substrate processing control system comprising:
    a film thickness distribution estimation controller that measures the film thickness of the substrate and estimates the film thickness distribution of the substrate based on the measurement result;
    a local polishing region setting controller for setting a local polishing region on the substrate based on the film thickness distribution;
    a polishing head selection controller for selecting a polishing head based on the size of the local polishing region;
    a model storage holding a recipe generating model that defines the relation between an input node and an output node, input nodes including (i) an attribute of the local polishing region that includes the estimated average film thickness thereof and (ii) a head type, and the output node comprises a recipe for a polishing process;
    a polishing recipe generator that puts an attribute of the local polishing region set by the local polishing region setting controller and the polishing head selected by the polishing head selection controller into the input node of the recipe generating model and determines a polishing recipe for polishing the local polishing region; and
    a polishing recipe transmitter for transmitting data of the polishing recipe to a polisher that performs local polishing,
    wherein the substrate processing control system controls local polishing to be performed on an entirely polished substrate, and
    wherein the recipe generating model has a condition of the entire polishing as an input node.

2. The substrate processing control system according to claim 1, wherein the input node of the recipe generating model comprises a plurality of input nodes that are the outline of the local polishing region.

3. The substrate processing control system according to claim 1 wherein the local polishing region setting processor changes a criterion for setting a local polishing region depending on whether the precision or throughput of substrate processing is given priority.

4. The substrate processing control system according to claim 1, wherein the film thickness distribution estimation processor estimates the film thickness distribution also based on an etching pattern of a substrate to be polished.

5. The substrate processing control system according to claim 1, further comprising:
    a simulator that simulates the film thickness distribution of a substrate and throughput to be achieved by local polishing according to the polishing recipe and determines whether the polishing recipe is to be adopted or not based on a simulation result.

6. The substrate processing control system according to claim 5,
    wherein the model storage holds a plurality of recipe generating models of different types,
    wherein the polishing recipe generator determines a plurality of polishing recipes using different recipe generating models, and
    wherein the simulator determines a single polishing recipe based on simulation results of the plurality of polishing recipes determined by using different recipe generating models.

7. The substrate processing control system according to claim 6, further comprising:
    a learning processer for performing learning on the recipe generating model based on results of simulations performed on a plurality of local polishing regions by the simulator.

8. The substrate processing control system according to claim 6, further comprising:
    a learning processor for performing learning on the recipe generating model based on a result of local polishing actually performed according to the polishing recipe.

9. The substrate processing control system according to claim 5, having an actual result data storage holding a previously generated polishing recipe and data on the film thickness distribution of a substrate polished by using the polishing recipe,
    wherein the substrate processing control system reads from the actual result data storage a predetermined number of polishing recipes approximate to the film thickness distribution of a substrate estimated by the film thickness distribution estimation processor, and
    wherein the simulator determines a single polishing recipe based on simulation results of a plurality of polishing recipes.

10. The substrate processing control system according to claim 5, further comprising:
    an output processor for outputting the simulation result obtained by the simulator.

11. The substrate processing control system according to claim 5, wherein the simulator comprises a simulation model.

12. The substrate processing control system according to claim 11, wherein the simulation model performs learning based on a result of local polishing actually performed according to the polishing recipe.

13. The substrate processing control system according to claim 1, further comprising:
a data receiver for receiving data on local polishing transmitted from a plurality of polishers connected to the data receiver via a network.

* * * * *